US005532373A

United States Patent [19]

Matsumoto et al.

[11] Patent Number: 5,532,373

[45] Date of Patent: Jul. 2, 1996

[54] ALUMINATE COMPLEX AND USE THEREOF IN PHOTOPOLYMERIZABLE COMPOSITION AND IMAGE-FORMING MATERIAL

[75] Inventors: Hirotaka Matsumoto; Jun Yamaguchi; Naoto Yanagihara, all of Shizuoka; Hisashi Yamamoto, Aichi, all of Japan

[73] Assignee: Fuji Photo Film Co., Ltd., Kanagawa, Japan

[21] Appl. No.: 311,003

[22] Filed: Sep. 22, 1994

Related U.S. Application Data

[63] Continuation of Ser. No. 22,432, Feb. 16, 1993, abandoned, which is a continuation of Ser. No. 597,244, Oct. 15, 1990, abandoned.

[30] Foreign Application Priority Data

| | | | |
|---|---|---|---|
| Oct. 13, 1989 | [JP] | Japan | 1-266601 |
| Dec. 26, 1989 | [JP] | Japan | 1-337688 |
| Dec. 26, 1989 | [JP] | Japan | 1-337690 |

[51] Int. Cl.$^6$ ..... C07F 5/06

[52] U.S. Cl. ..... 546/4; 544/4; 544/64; 544/181; 544/225; 546/8; 548/103; 548/107; 548/402; 549/3; 549/209; 549/212; 556/170; 556/175; 556/176; 556/181; 556/182; 430/281.1; 430/332

[58] Field of Search ..... 549/3, 209, 212, 549/556, 175, 170, 176, 181, 182; 546/4, 8; 544/4, 64, 181, 225, 548, 103, 107, 402

[56] References Cited

U.S. PATENT DOCUMENTS

| | | | |
|---|---|---|---|
| 4,360,584 | 12/1982 | Halm | 430/286 |
| 4,937,338 | 6/1990 | Flohr | 544/4 |
| 4,996,340 | 2/1991 | Miller | 556/170 |

FOREIGN PATENT DOCUMENTS

| | | |
|---|---|---|
| 0091131 | 10/1983 | European Pat. Off. . |
| 223587 | 5/1987 | European Pat. Off. . |

OTHER PUBLICATIONS

Chemical Abstracts, vol. 82, No. 20, May 19, 1975, Columbus, Ohio, USA, V. A. Egorova et al.: "Light–Sensitive Composition for Making Relief Printing Forms", p. 489; Ref. No. 132156H.

Chemical Abstracts, vol. 95, No. 20, Nov. 16, 1981, Columbus, Ohio, USA, R. V. Basova et al.: "Binary Sodium–Aluminum Organic Initiators of Anionic Polymerization", p. 4; Ref. No. 169865H.

*Primary Examiner*—Mark L. Berch
*Attorney, Agent, or Firm*—Sughrue, Mion, Zinn, Macpeak & Seas

[57] ABSTRACT

An aluminate complex represented by formula (I):

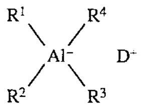

(I)

with the groups in the aluminate complex as defined in the specification, and which is capable of radical generation upon photoexcitation; a photopolymerizable composition comprising an ethylenically unsaturated polymerizable compound and the aluminate complex; and an image-forming material comprising a support, an organoaluminum compound anion represented by formula (I'):

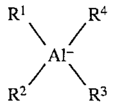

(I')

with the groups in the organoaluminum compound anion as defined in the specification, and a photobleachable dye; are disclosed.

3 Claims, No Drawings

ALUMINATE COMPLEX AND USE THEREOF IN PHOTOPOLYMERIZABLE COMPOSITION AND IMAGE-FORMING MATERIAL

This is a Continuation of application Ser. No. 08/022,432 filed Feb. 16, 1993, abandoned, which is a Continuation of application Ser. No. 07/597,244 filed Oct. 15, 1990, abandoned.

FIELD OF THE INVENTION

This invention relates to aluminate complexes, and photopolymerizable compositions in which the aluminate complexes are used. More particularly, the invention relates to aluminate complexes having radical generating ability with improved stability, and also to highly sensitive, spectrally sensitized photopolymerizable compositions containing said aluminate complexes and suited for use in producing lithographic sheets or films, resin reliefs, resists or photomasks for printed circuit board manufacture, black and white or color transfer development sheets of development sheets, for example.

The present invention further relates to image forming materials useful in the fields of copiers, facsimiles, printers, labels, color proofs, overhead projectors and copied original drawings, for example. In particular, it relates to image forming materials in which a dye bleaching method is used. More particularly, it relates to image forming materials containing a photobleachable dye and an organoaluminum compound anion. Furthermore, it relates to image forming materials of the monosheet type in which no unnecessary expendable materials are used.

BACKGROUND OF THE INVENTION

Although only a limited number of studies have been conducted on aluminum compounds which themselves have radical generating ability, a possibility exists that such compounds might be used as radical generators. For instance, cases have been reported where mixing of dichloroethylaluminumacrylonitrile complex with butadiene resulted in radical copolymerization [W. Kuran et al., "Die Makromolekulare Chemie", 174, 73–80 (1973)] or radicals were detected in ESR spectrometry of oxidation products from alkyldiphenoxyaluminum compounds [Pasynkiewicz et al., "Journal of Organometallic Chemistry", 141, 149–156 (1977)]. Such reports suggest that aluminum compounds have radical generating ability.

While few studies have dealt with the radical generating ability of ate complexes of aluminum (aluminate complexes), it can be expected by analogy that the ate complexes might have radical generating ability. However, organoaluminum compounds are generally unstable in air and difficult to handle during their synthesis. For these and other reasons, few attempts have so far been made to use them as radical generators for various purposes.

On the other hand, photopolymerizable compositions basically contain a photopolymerization initiator and an addition-polymerizable compound having two or more ethylenically unsaturated bonds (hereinafter referred to as "polyfunctional monomers"). Upon irradiation with light, said compositions harden, show changes in tackiness and/or become insoluble in solvents. Owing to these properties, such compositions are widely used in photography, printing, metal surface treatment and inks, among others. Theories and application examples are described in a number of monographs. For example, detailed description can be found in J. Kosar: "Light Sensitive Systems", John Wiley & Sons, New York, 1965, pages 158–193; and K. I. Jacobson and R. E. Jacobson: "Imaging Systems", John Wiley & Sons, New York, 1976, pages 181–222.

Recently, image-forming systems which utilize light-sensitive microcapsules containing a photopolymerizable composition have been proposed as a method of forming images using a photopolymerizable composition. Thus, for instance, a method of forming color images which comprises exposing to light a color-forming sheet coated with microcapsules containing a dye plus a photopolymerizable composition composed of a vinyl compound and a photopolymerization initiator, then placing an image-receiving sheet over the exposed color-forming sheet and applying pressure on the whole set of sheets is disclosed in JP-A-57-124343, JP-A-57-179836 and JP-A-57-197538 (the term "JP-A" as used herein means an "unexamined published Japanese Patent Application").

Furthermore, in recent years, the possibility of applying such photopolymerizable compositions to full-color light-sensitive materials spectrally sensitized down to the visible light range has been investigated.

Thus, for example, a method of sensitizing a photopolymerizable composition is described in "Nippon Shashin Gakkaishi" (Journal of the Society of Photographic Science and Technology of Japan), 49 (3), 230 (1986) and "Kino Zairyo" (Function & Materials), September 1983 issue, pages 48–60. A method of spectrally sensitizing an organic peroxide initiator with organic dyes is described in JP-A-59-89340. Furthermore EP-A-223587 discloses organic cationic dye-organoboron anion salts as novel photopolymerization initiators.

In particular the method using organic cationic dye compound-organoboron compound anion salts as light-sensitive initiators is an advantageous method since the cationic dye compounds can be selected within a wide range and therefore photopolymerizable compositions sensitive to an arbitrarily selected wavelength can be designed.

However, boron compounds are generally expensive, while organoaluminum compounds are generally unstable in air. Consequently their commercial use has been limited.

Meanwhile, various image-forming materials are known. Thus, for example, silver halide photographic materials, materials in which a photopolymer is used (e.g. materials for lithography and relief printing), diazo photographic materials, and image-forming materials involving photobleaching of dyes are known.

Among these materials, the image-forming materials utilizing the dye photobleaching method which comprises photobleaching of dyes in imagewise exposed portions to give an image are characterized in that the image forming procedure is easy and simple and the process is a dry one and that in principle, the image-forming materials can readily modified for color imaging.

For photobleaching of dyes, methods using organo-boron compounds are known. Thus, for instance, combinations of organoboron compounds and bleachable dyes are described, for example, in British Patents Nos. 1,386,269, 1,370,058, 1,370,059 and 1,370,060 and U.S. Pat. No. 4,307,182. These organoboron compound-bleachable dye combinations can readily and directly form images by irradiation with light.

The light-sensitive materials in which an organoboron compound-bleachable dye combination is used have been variously modified. For instance, U.S. Pat. No. 4,307,182 discloses a method of fixing images with an acid, and European Patent 109,772 discloses a method of fixing images with ultraviolet radiation. Furthermore, U.S. Pat. No. 4,450,227 discloses a method of reducing the solvent quantity or attaining color imaging by dispersing such an organoboron compound-bleachable dye combination in a binder.

However, in spite of such various modifications, organoboron compounds are generally expensive, as mentioned above, limiting the commercial use of the materials mentioned above.

SUMMARY OF THE INVENTION

The present inventors made extensive and detailed investigations in an effort to provide ate complexes of aluminum having improved stability, wherein the protocol included modifying the substituent species on the aluminum atom as well as the cation species in the aluminate complexes. As a result, the present inventors have succeeded in developing aluminate complexes which are stable, in air and have radical generating capability.

Accordingly, it is an object of the invention to provide an aluminate complex which can be derived from inexpensive starting materials, is sensitive to light sources of visible light or higher wavelengths, is highly sensitive, has improved stability and is suited for use as a photopolymerization initiator. Further, it is an object of the invention to provide a light-sensitive composition containing the aluminate complex exhibiting the above characteristics. More detailedly, it is an object to provide an inexpensive photopolymerizable composition which can be advantageously used in visible light-sensitive high-sensitivity planographic or lithographic plates, resin relief plates, resists or photomasks for printed circuit board manufacture, and black and white or color image-forming materials.

Another object of the invention is to provide an image forming material in which the dye is bleached by exposure to light and for the use of less expensive raw materials in the manufacture of the material.

A further object is to provide an image-forming material with which images can be produced by an easy and simple procedure consisting in merely exposing the material to light and for the use of more inexpensive raw materials in the manufacture of such an image-forming material.

A still further object of the invention is to provide a monosheet type image forming material which requires no unnecessary expendable materials and for the manufacture of which more inexpensive raw materials can be used.

As a result of the extensive investigations, the present inventors have discovered a class of radical generating compounds derived from a more inexpensive material, namely aluminum, than found in the prior art. Thus, the objects of the invention could be accomplished by providing a aluminate complex resulting from modification of the substituent species on the aluminum atom and of the cation species, and, further, by providing a photopolymerizable composition containing at least (a) an ethylenic unsaturated bond-containing polymerizable compound and (b) the aluminate complex mentioned above.

Some of the above-mentioned objects of the invention could be attained by providing an image-forming material which has, on at least one side or face thereof, a layer of a composition containing an organoaluminum compound anion and a photobleachable dye.

DETAILED DESCRIPTION OF THE INVENTION

The term "aluminate complex" as used herein generally includes within the meaning thereof those compounds or entities which are composed of an anion species containing an aluminum atom as the central atom with four substituents thereon and a cation species ionically bound to the anion species. Lithium aluminum hydride and derivatives thereof, which are generally used as reducing agents, also come under the category of the aluminum complex.

Among the aluminate complexes according to the invention, those represented by formula (I) shown below are preferred.

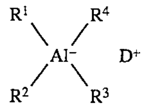

(I)

In the above formula, $D^+$ is a cationic compound; $R^1$, $R^2$, $R^3$ and $R^4$ may be the same or different and each is selected from the group consisting of an unsubstituted or substituted alkyl group, which may optionally have an unsaturated bond or bonds, an unsubstituted or substituted aryl group, an unsubstituted or substituted aralkyl group, an unsubstituted or substituted alkaryl group, an unsubstituted or substituted alkenyl group, an unsubstituted or substituted alkynyl group, an alicyclic group, an unsubstituted or substituted aryloxy group, an unsubstituted or substituted arylthio group, an unsubstituted or substituted arylamino group, an unsubstituted or substituted arylseleno group, an unsubstituted or substituted cycloalkyl group and an unsubstituted or substituted heterocyclic group; and two or more of $R^1$, $R^2$, $R^3$ and $R^4$ may be combined to form a cyclic structure. Examples of the substituents for the groups include, for example, an alkyl group having 1 to 16 carbon atoms, an aryl group and a halogen atom. Examples of the heterocyclic group include ones containing nitrogen atom, sulfur atom, oxygen atom, and/or selenium atom as the hetero atom(s).

Among these compounds, those .compounds in which at least one of $R^1$, $R^2$, $R^3$ and $R^4$ is a group as defined by formulae (II), (III) or (IV) shown below have good stability, and hence are preferred.

$$-X-R^5 \qquad (II)$$

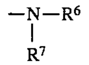

(III)

$$-N=R^8 \qquad (IV)$$

In the above formulae, X is an oxygen, sulfur or selenium atom; $R^5$, $R^6$ and $R^7$ may be the same or different and each is selected from the group consisting of a hydrogen atom, an unsubstituted or substituted alkyl group, an unsubstituted or substituted aryl group, an unsubstituted or substituted aralkyl group and an unsubstituted or substituted heterocyclic group; $R^6$ and $R^7$ may combinedly form a cyclic structure; and $R^8$ is an aliphatic, aromatic or heterocyclic group, which may optionally have one or more substituents. Examples of the substituents for the groups include, for example, an alkyl group having 1 to 16 carbon atoms, an aryl group and a halogen atom. Examples of the heterocyclic group include ones containing nitrogen atom, sulfur atom, oxygen atom and/or selenium atom as the hetero atom(s).

Among the aluminate complexes according to the present invention, those aluminate complexes are preferred in which at least one of the four substituents on the aluminum atom is a substituted hydroxy, substituted mercapto, substituted seleno or substituted amino group, and most preferably an aryloxy group.

In cases where $R^1$, $R^2$, $R^3$ and $R^4$ in the above formula (I) are all different than the groups of the above formulae (II) to (IV), an alkyl group of 1 to 20 carbon atoms, which may optionally contain an unsaturated bond or bonds, an aryl group of 6 to 20 carbon atoms and an aralkyl group of 7 to 20 carbon atoms are preferred as the substituents. Where $R^1$, $R^2$, $R^3$ and $R^4$ are alkyl groups, any two of them may be combined to each other to form a hetero atom-containing ring.

Particularly preferred as $R^1$, $R^2$, $R^3$ and $R^4$ are an alkyl group of 1 to 10 carbon atoms, which may contain an unsaturated bond or bonds, an aryl group of 6 to 10 carbon atoms and an aralkyl group of 7 to 10 carbon atoms.

Among the substituents represented by $R^5$ in the above formula (II), an aryl group is preferred. The term "aryl group" as used herein includes within the meaning thereof aromatic rings which may optionally contain a hetero atom or atoms, among which the benzene ring is particularly preferred. For providing the compound of formula (I) with stability, it is preferable that the aryl group be substituted in position 2 (relative to X in the above formula (II)). The aryl group may further be nuclearly substituted. Preferred as the substituent(s) in such case are an alkyl group of 1 to 20 carbon atoms, which may optionally contain an unsaturated bond or bonds, an aryl group of 6 to 20 carbon atoms, an alkoxy group of 1 to 20 carbon atoms, an aryloxy group of 6 to 20 carbon atoms, a halogen atom and an alkoxycarbonyl group of 2 to 20 carbon atoms, for example. Particularly preferred is an alkyl group of 1 to 10 carbon atoms, more preferably such an alkyl group containing a tertiary carbon atom in position alpha (α) relative to the benzene ring. The substituent(s) may serve as a linking group(s) to be bound to $R^1$, $R^2$, $R^3$ or $R^4$, for instance.

Among the substituents represented by X in the above formula (II), the oxygen atom is preferred.

Preferred among the substituents represented by $R^6$ and $R^7$ in the above formula (III) are an alkyl group of 1 to 20 carbon atoms, which may optionally contain an unsaturated bond or bonds and an aryl group of 6 to 20 carbon atoms. When $R^1$, $R^2$, $R^3$ and $R^4$ are alkyl groups, any two of them may combinedly form a hetero atom-containing ring.

The "cationic compound" represented by $D^+$ in the above formula (I) includes within the meaning thereof all positively charged species. Preferred among inorganic species or compounds are ions of metals of group 1 or 2 of the periodic table, such as sodium, potassium and magnesium, and among organic species or compounds, those containing a hetero atom or atoms, such as an oxygen, sulfur and/or nitrogen atom or atoms. Particularly preferred are a quaternary ammonium cation or an organic cationic dye.

When $D^+$ is a quaternary ammonium cation, it may be represented by the following formula (V):

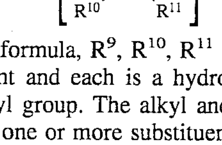

(V)

In the above formula, $R^9$, $R^{10}$, $R^{11}$ and $R^{12}$ may be the same or different and each is a hydrogen atom, an alkyl group, or an aryl group. The alkyl and/or aryl group may optionally have one or more substituents.

Preferred among the substituents represented by $R^9$, $R^{10}$, $R^{11}$ and $R^{12}$ are an alkyl group of 1 to 20 carbon atoms, which may optionally contain an unsaturated bond or bonds, and an aryl group of 6 to 20 carbon atoms. When $R^9$, $R^{10}$, $R^{11}$ and $R^{12}$ are alkyl groups, any two of them may combinedly form a hetero atom-containing ring. An alkyl group of 1 to 10 carbon atoms and an aryl group of 6 to 10 carbon atoms are particularly preferred.

As specific examples of the quaternary ammonium cation, there may be mentioned tetramethylammonium cation, tetraethylammonium cation, tetrabutylammonium cation, phenyltrimethylammonium cation, benzyltrimethylammonium cation, dodecyltrimethylammonium cation and dimethylethylhexylammonium cation, for example.

When $D^+$ is an organic cationic dye, use may be made of such organic cationic dyes as cationic methine or polymethine dyes, preferably cyanine dyes, hemicyanine dyes, styryl dyes and azamethine dyes, more preferably dyes having at least one indolenine or benzoselenazole structure; carbonium dyes, preferably triarylmethane dyes; pyrylium compounds, preferably pyrylium dyes and thiapyrylium dyes; quinonimine dyes, preferably azine dyes, thiazine dyes and oxazine dyes; xanthene dyes, preferably rhodamine dyes; acridine dyes; azulenium dyes; for example; either singly or in combination.

The above-mentioned organic cationic dyes, which are commercially available or recognized in the art, can be used in the practice of the present invention. For examples of these dyes, reference may be made to the section "Enkisei Senryo (Basic Dyes)" in "Senryo Binran (Manual of Dyes)" edited by the Organic Chemical Society of Japan; T. H. James: "The Theory of the Photographic Process", Macmillan Publishing Co., Inc., 1977, pages 194–290; "Kinosei Shikiso no Kagaku (Chemistry of Functional Dyes)", CMC Shuppansha, 1981, pages 1–32, 189–206 and 401–413; JP-A-59-189340; and EP-A-223587, among others.

Among the above-mentioned dyes, cyanine dyes and xanthene dyes are particularly useful in the practice of the present invention. Examples of such cyanine dyes are dyes of the following formula (VI):

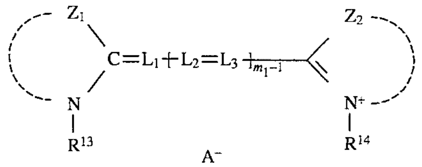

(VI)

In the above formula, $Z_1$ and $Z_2$ each independently is a group of atoms which is necessary for the completion of a heterocyclic nucleus generally used in cyanine dyes, preferably a thiazole, thiazoline, benzothiazole, naphthothiazole, oxazole, oxazoline, benzoxazole, naphthoxazole, tetrazole, pyridine, quinoline, imidazoline, imidazole, benzimidazole, naphthoimidazole, selenazoline, selenazole, benzoselenazole, naphthoselenazole or indolenine nucleus or the like. The nucleus may be substituted by one or more substituents each independently selected from the group consisting of an alkyl group of 1 to 4 carbon atoms, a halogen atom, an aryl group of 6 to 12 carbon atoms, a hydroxyl group, an alkoxy group of 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group, a nitro group and the like.

$L_1$, $L_2$ or $L_3$ is a methine group or a substituted methine group. Preferred as the substituted methine group are methine groups substituted by an alkyl group of 1 to 4 carbon atoms, an unsubstituted or substituted aryl group of 6 to 12 carbon atoms, an alkoxy group of 1 to 4 carbon atoms, an aralkyl group of 7 to 12 carbon atoms or the like.

$L_1$ and $R^{13}$ and/or $L_3$ and $R^{14}$ may combinedly form a ring through an alkylene crosslink. A 5- or 6-membered ring is preferred as the ring.

The coefficient $m_1$ is an integer of 1 to 4. When $m_1$ is 2 to 4, namely when the unit [$L_2$=$L_3$] occurs repeatedly, one $L_2$ and the neighboring $L_2$ may combinedly form a ring.

$R^3$ and $R^{14}$ each independently is an unsubstituted alkyl group (preferably of 1 to 8 carbon atoms) or a substituted alkyl group. As the substituent for the alkyl group, examples include an alkyl group of 1 to 8 carbon atoms, a halogen atom, an aryl group of 6 to 12 carbon atoms, an aralkyl group of 7 to 12 carbon atoms, a hydroxyl group, a carboxyl group, a sulfo group and an alkoxy group of 1 to 4 carbon atoms, for instance. The alkylene moiety of the substituted alkyl group preferably contains 1 to 5 carbon atoms. As examples of the substituted alkyl group, there may be mentioned β-sulfoethyl, γ-sulfopropyl, γ-sulfobutyl, δ-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3-tetrafluoropropyl, 3,3,3-trifluoroethyl, allyl and other substituted alkyl groups generally used as the N-substituents in cyanine dyes.

$A^-$ is the aluminum compound anion moiety in the above structural formula (I).

Dyes of the following formula (VII), for instance, are provided as specific examples of the xanthene dyes useful in the practice of the present invention.

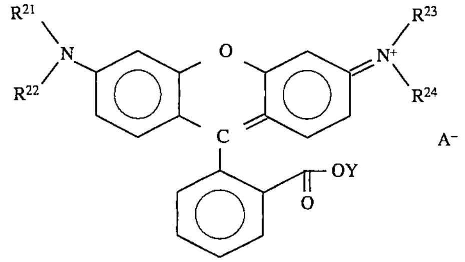

(VII)

In the above formula, $R^{21}$, $R^{22}$, $R^{23}$ and $R^{24}$ each independently is a hydrogen atom, an alkyl group, an alkoxy group, an aralkyl group or aryl group, and is preferably an alkyl group of 1 to 8 carbon atoms or an aryl group of 6 to 10 carbon atoms, an alkoxy group of 1 to 8 carbon atoms, an aralkyl group of 7 to 12 carbon atoms or the like.

$R^{21}$, $R^{22}$, $R^{23}$ and $R^{24}$ may optionally have at least one substituent, preferably a halogen atom or an alkyl, aryl, alkoxy, aryloxy, alkylthio, arylthio, carboxyl, acylcarbonyl, alkylsulfamoyl, alkylcarbamoyl, acetyl, acetoxy, cyano, trichloromethyl, trifluoromethyl or nitro group or the like.

$A^-$ is the aluminum compound anion found in the above formula (I) and Y is a hydrogen atom, an alkyl or aryl group or an alkali metal.

Given in the following are preferred examples usable in the practice of the present invention for the quaternary ammonium salt moiety (T-Nos.) and of the organic cationic dye moiety (D-Nos.) for the "cationic compound" represented by $D^+$, and of the organoaluminum compound anion moiety (A-Nos.).

Salts resulting from arbitrary combination of any of these organic cationic moieties with any of these organoaluminum compound anion moieties may be used as preferred compounds in the practice of the invention. However, such salts are by no means limitative of the scope of the present invention.

$\overset{+}{N}(C_2H_5)_4$ T-1

$\overset{+}{N}(C_4H_9)_4$ T-2

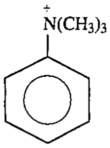

T-3

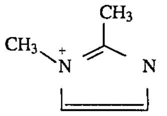

T-4

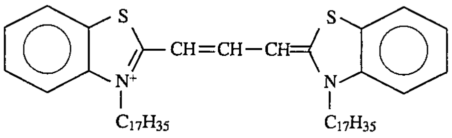

D-1

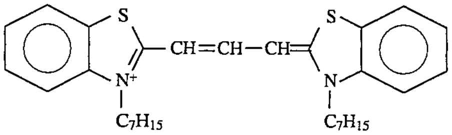

D-2

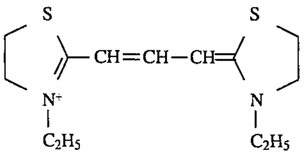

D-3

-continued
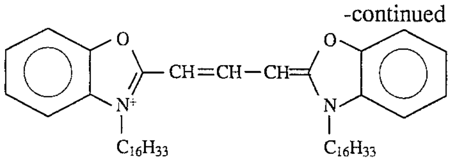
D-4
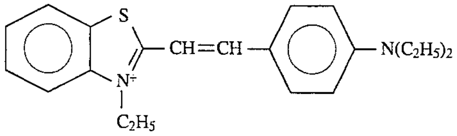
D-5
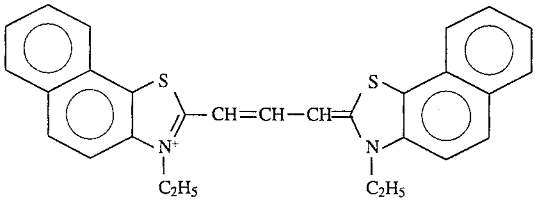
D-6
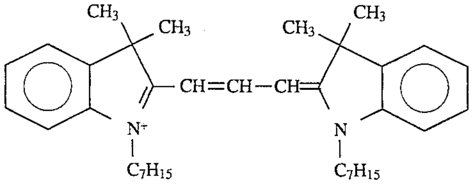
D-7
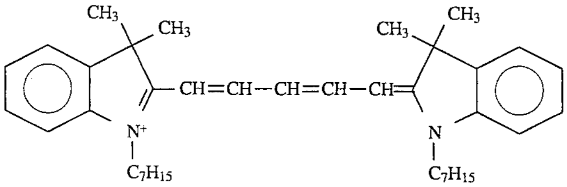
D-8
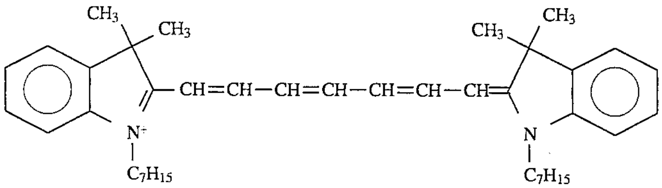
D-9
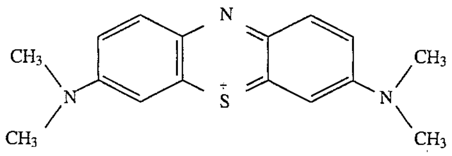
D-10
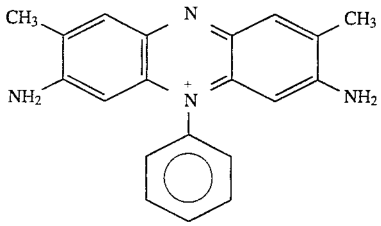
D-11
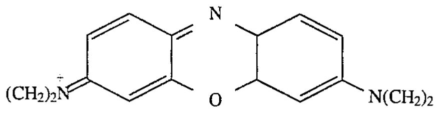
D-12

-continued
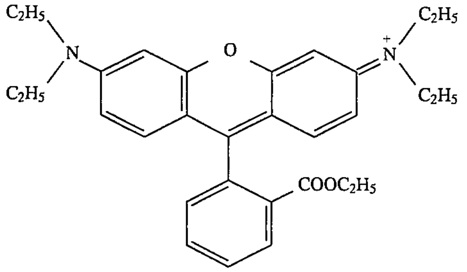
D-13
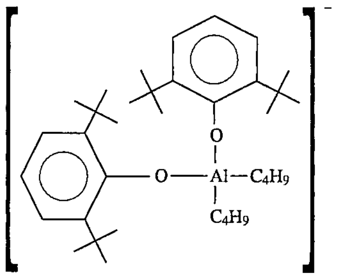
A-1
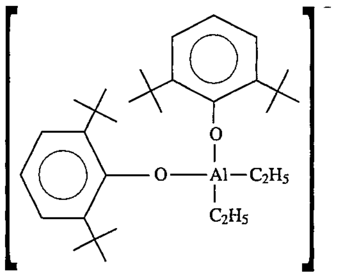
A-2
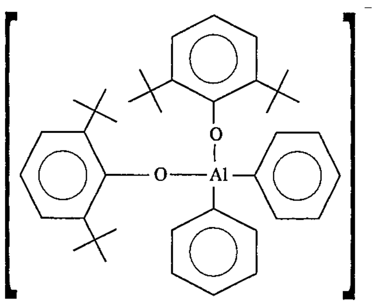
A-3
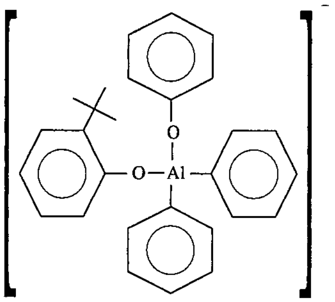
A-4
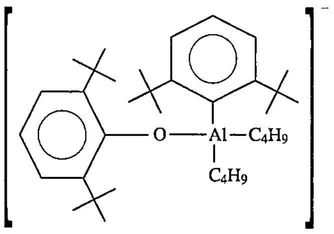
A-5

-continued
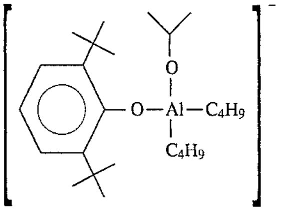
A-6
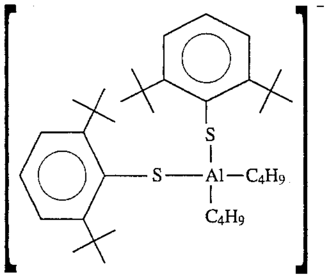
A-7
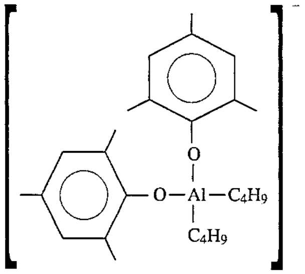
A-8
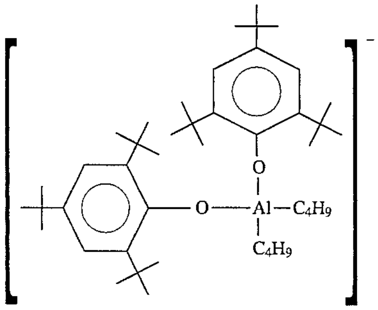
A-9
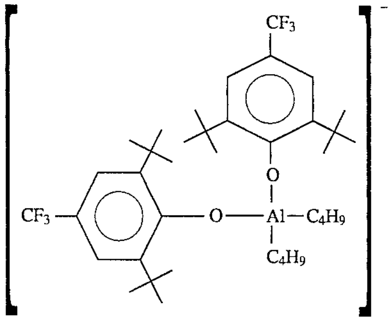
A-10
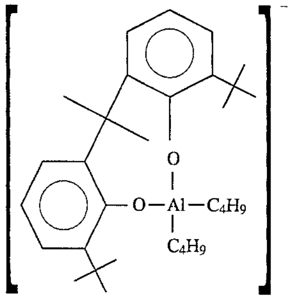
A-11

-continued
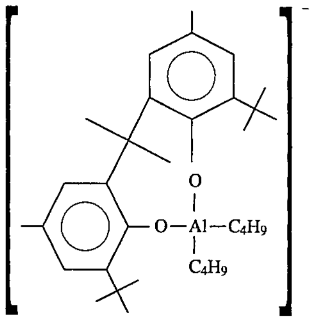
A-12
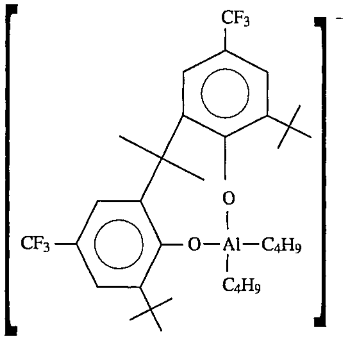
A-13
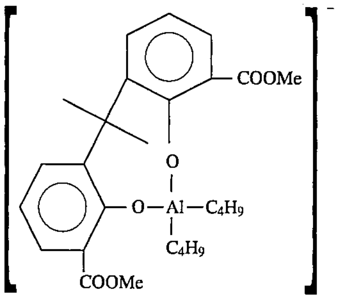
A-14
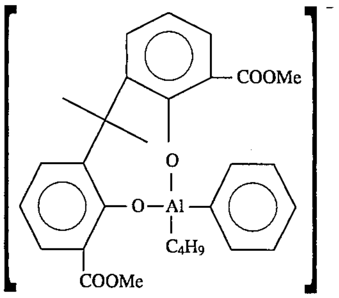
A-15
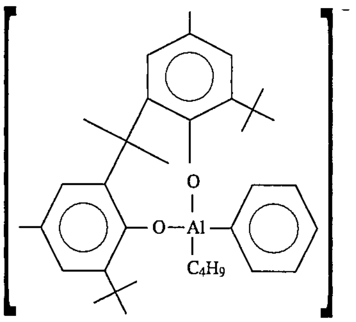
A-16

-continued
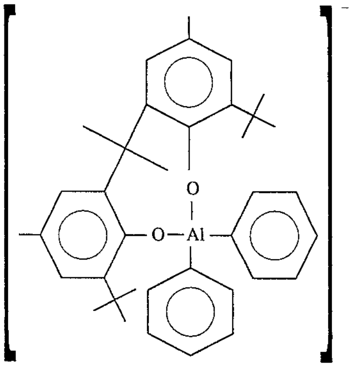
A-17
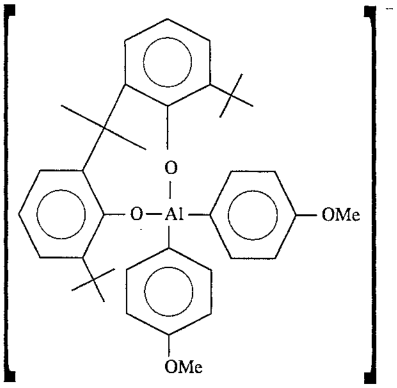
A-18
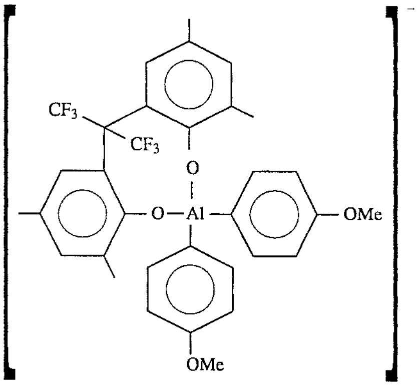
A-19
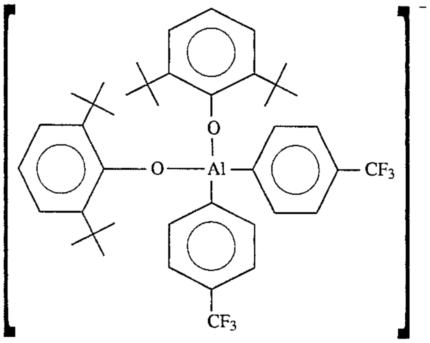
A-20

-continued
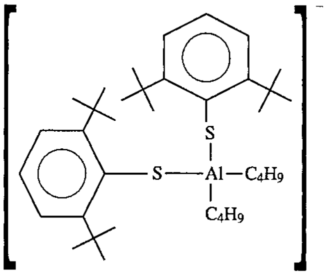
A-21
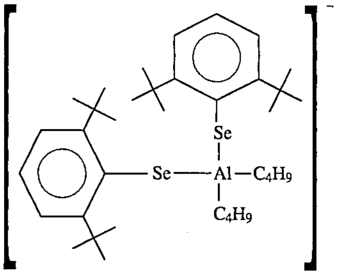
A-22
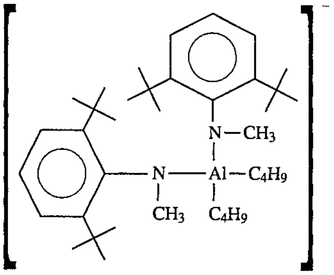
A-23
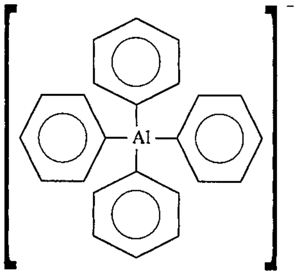
A-24
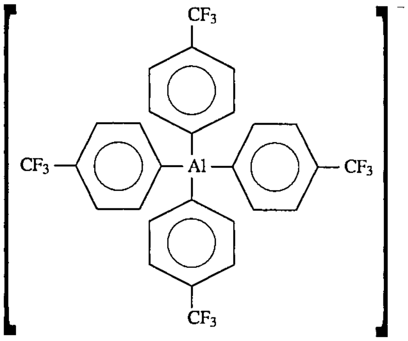
A-25
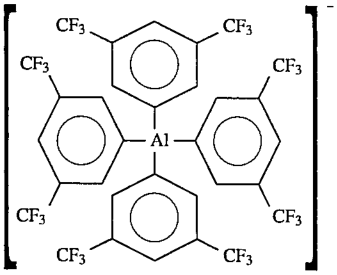
A-26

The above-mentioned aluminate complexes of formula (I) may be prepared by uniformly mixing an organic cationic salt with an organoaluminum compound anion salt in an organic solvent. They may be used either as prepared or after isolation and purification.

The organoaluminum compounds according to the invention can be synthesized by various methods. For example, they can be synthesized by reacting a trialkylaluminum, which is known to be inexpensive, with a phenol compound, then reacting the resulting dialkylphenoxyaluminum or monoalkyl-diphenoxyaluminum with an alkyllithium and further exchanging the counter ion for a quaternary ammonium. Furthermore, counter ion exchange between this quaternary salt of organoaluminum compound anion and a halide salt of a cationic dye gives the corresponding organoaluminum compound anion salt of organic cationic dye compound.

The following references can be referred to, among others: G. Witt et al., Ann., 566, 113 (1950) for disclosures of lithium tetraphenylaluminate and E. B. Baker et al., "J. Am. Chem. Soc., 75", 5193 (1953) for sodium tetraethylaluminate.

A preferred method of synthesizing compounds of the formula $[(PhO)_2R_2Al]NR'_4$, for instance, comprises the following three steps:

(Step 1):

$$R_3Al+2\rightarrow PhOH\rightarrow(PhO)_2RAl+2\times RH$$

(Step 2):

$$(PhO)_2RAl+RLi\rightarrow[(PhO)_2R_2Al]Li$$

(Step 3):

$$[(PhO)_2R_2Al]Li+HalNR'_4\rightarrow[(PhO)2R_2Al]NR'_4+LiHal$$

In the above formulae, R and R' each is an alkyl group, an aryl group or the like, Ph is a phenyl group and Hal is a halogen atom.

In the practice of the present invention, the aluminate complexes may be used in various different ways such that they can serve as radical generators.

For example, the aluminate complexes of the present invention can be used in a recording system utilizing radical generation. In this case, the aluminate complex is preferably used in combination with a dye having an appropriate absorption within, practically, the range of from 200 to 1500 nm to generate a radical by energy transmission from the dye when irradiated with a light having a wavelength corresponding to the absorbing wavelength of the dye so as to 1) initiate polymerization of polymerizable monomers; or to 2) promote oxidization of organic compounds, such as leuco dye, to develop the color.

Further, the aluminate complex can also be used in the organic synthetic reaction or the polymer synthetic reaction. In this case, the aluminate complex can be added into the system with preparing it in the system without isolating.

Examples of an embodiment of such the system utilizing the aluminate complex include the photopolymerizable composition of the present invention.

The ethylenic unsaturated bond-containing polymerizable compound to be used in the photopolymerizable composition of the present invention is a compound having at least one ethylenic unsaturated bond in the chemical structure thereof and it has a chemical form such as a monomer, prepolymer (e.g., dimer, trimer, other oligomer, or a mixture of these or a copolymer of these). As examples thereof, examples include unsaturated carboxylic acids and salts thereof, esters thereof with aliphatic polyhydric alcohol compounds, and amides thereof with aliphatic polyvalent amine compounds, among others.

Specific examples of the unsaturated carboxylic acids are acrylic acid, methacrylic acid, itaconic acid, crotonic acid, isocrotonic acid and maleic acid.

As the salts of unsaturated carboxylic acids, there examples include, among others, sodium and potassium salts of the acids specifically mentioned above.

Examples of the esters of aliphatic polyhydric alcohols and unsaturated carboxylic acids are acrylate esters, such as ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanedioldiacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetraacrylate, sorbitol pentaacrylate, sorbitol hexaacrylate and polyester acrylate oligomers; methacrylate esters, such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis[p-(3-methacryloxy-2-hydroxypropoxy)phenyl]dimethylmethane and bis[p-(acryloxyethoxy)phenyl]dimethylmethane; itaconate esters, such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonate esters, such as ethylene glycol dicrotonate, tetramethylene glycol dicrotonate, pentaerythritol dicrotonate and sorbitol tetracrotonate; isocrotonate esters, such as ethylene glycol diisocrotonate, pentaerythritol diisocrotonate and sorbitol tetraisocrotonate; and maleate esters, such as ethylene glycol dimaleate, triethylene glycol dimaleate, pentaerythritol dimaleate and sorbitol tetramaleate. Mixtures of the above-mentioned esters may also be used.

The amides of aliphatic polyvalent amine compounds and unsaturated carboxylic acids include, among others, methylenebisacrylamide, methylenebismethacrylamide, 1,6-hexamethylenebisacrylamide, 1,6-hexamethylenebismethacrylamide, diethylenetriamine trisacrylamide, xylylenebisacrylamide and xylylenebismethacrylamide.

Furthermore, polymerizable color image forming substances, for example, compounds containing a vinyl group within the dye or leuco dye molecule, may be used as the polymerizable compound.

The content of the aluminate complex is 0.01 to 50% by weight, preferably 0.2 to 40% by weight, more preferably 5 to 20% by weight based on the polymerizable compound. When it is less than 0.01% by weight, sensitivity insufficiency will result whereas when it is more than 50% by weight, no sensitivity improvement can be expected.

The above-mentioned novel photopolymerizable composition containing any of the ethylenically unsaturated polymerizable compounds mentioned above and any of the above-mentioned aluminate complexes can be used in diverse fields.

For example, layers containing the photopolymerizable composition and a binder polymer as disposed on supports can be used in conventional manners in a variety of fields, for example, as resists for the manufacture of printing plates and printed circuit boards as described, for example, in U.S. Pat. Nos. 4,604,342, 4,587,199, 4,629,680, 4,415,652, 4,431,723 and 4,550,073 and JP-A-61-285444 and JP-A-61-213213, as color proof materials as described, for example, in JP-A-62-67529 and U.S. Pat. No. 4,604,340, and as recording materials of the photorecording-thermal development type, as described in JP-A-60-11952 and JP-A-61-123838.

Although the photopolymerizable composition according to the present invention has high sensitivity and is sensitive to visible light, reducing agents, for example oxygen scavengers, as well as active hydrogen donor chain transfer agents and other compounds capable of promoting the polymerization in the chain transfer manner can be used additionally as auxiliarie compounds for promoting the polymerization.

The oxygen scavengers that have been found useful include phosphines, phosphonates, phosphites, stannous salts and other compounds readily oxidizable by oxygen. Examples of such compounds are N-phenylglycine, trimethylbarbituric acid, N,N-dimethyl-2,6-diisopropylaniline and N,N,N-2,4,6-pentamethylaniline. Further examples are thiols described, for example, in U.S. Pat. No. 4,414,312 and JP-A-64-13144, and thioketones described, for example, in U.S. Pat. No. 3,558,322 and JP-A-64-17048.

The organoaluminum compound anion salt of an organic cationic dye compound according to the present invention, when used in combination with other photopolymerization initiators, affords improved sensitivity. Preferred examples of the photopolymerization initiators are aromatic ketones, such as benzophenone, 4,4'-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzil, anthraquinone, 2-tert-butylanthraquinone, 2-methylanthraquinone, xanthone, thioxanthone, 2-chlorothioxanthone, 2,4-diethylthioxanthone, fluorenone and acridone; benzoin and benzoin ethers, such as benzoin methyl ether, benzoin ethyl ether, benzoin isopropyl ether and benzoin phenyl ether; 2,4,5-triarylimidazole dimers, such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; polyhalogenated compounds, such as carbon tetrabromide, phenyl tribromomethyl sulfone, compounds (e.g., polyhalogenated compounds) described in JP-A-53-133428, JP-B-57-1819 (the term "JP-B" as used herein means an "examined Japanese Patent Publication") and JP-B-57-6096 and U.S. Pat. No. 3,615,455; trihalomethyl-containing s-triazine derivatives described in JP-A-58-29803, such as 2,4,6-tris-(trichloromethyl)-s-triazine, 2-methoxy- 4,6-bis(trichloromethyl)-s-triazine, 2-amino-4,6-bis(trichloromethyl)-striazine and 2-(p-methoxystyryl)-4,6-bis(trichloromethyl)-striazine; organic peroxides described, for example, in JP-A-59-189340, such as methyl ethyl ketone peroxide, cyclohexanone peroxide, 3,3,5-trimethylcyclohexanone peroxide, benzoyl peroxide, di-tert-butyl diperoxyisophthalate, 2,5-dimethyl-2,5-di(benzoylperoxy)hexane, tert-butyl peroxybenzoate, α,α'-bis(tert-butylperoxyisopropyl)benzene, dicumyl peroxide and 3,3',4,4'-tetra(tert-butylperoxycarbonyl)benzophenone; azinium salts described, for example, in U.S. Pat. No. 4,743,530; organic boron compounds described, for example, in European Patent 0223587, such as tetramethylammonium triphenylbutylborate, tetrabutylammonium triphenylbutylborate and tetramethylammonium tri(p-methoxyphenyl)butylborate; diaryliodonium salts, iron arene complexes and other photopolymerization initiators recognized in the art.

The content of the photopolymerization initiator for sensitivity improvement is preferably 0.01 to 20% by weight, more preferably 0.2 to 15% by weight, most preferably 5 to 10% by weight, based on the whole photopolymerizable composition. When it is less than 0.01% by weight, the sensitivity improvement is weak; when it is more than 20% by weight, sensitivity improvement cannot be expected.

The photopolymerizable composition according to the present invention may contain a heat polymerization inhibitor principally for the purpose of inhibiting polymerization of the photopolymerizable composition during shelf-life or storage. As examples of the heat polymerization inhibitor, examples include among others, p-methoxyphenol, hydroquinone, alkyl- or aryl-substituted hydroquinones, tert-butylcatechol, pyrogallol, cuprous chloride, chloranil, naphthylamine, β-naphthol, 2,6-di-tert-butyl-p-cresol, pyridine, nitrobenzene, dinitrobenzene, p-toluidine, methylene blue-organic copper, and methyl salicylate. These heat polymerization inhibitors are contained in the photopolymerizable composition preferably in an amount within the range of 0.001 to 5 parts by weight per 100 parts of the ethylenically unsaturated compound(s).

The photopolymerizable composition according to the present invention has a high level of sensitivity and at the same time is sensitive to visible radiation, so that it is particularly suited for use in image-forming systems in which microcapsules are used.

For use in such image forming systems in which microcapsules are used, reference may be made to JP-A-57-197538, JP-A-61-130945 (corresponding to U.S. Pat. No. 4,587,194), JP-A-58-88739 (corresponding to U.S. Pat. Nos. 4,399,209 and 4,822,714) and JP-A-58-88740 (corresponding to U.S. Pat. No. 4,440,846) and EP-A-223587, among others. This image forming method comprises, for example, coating a support with microcapsules containing a color image forming substance (e.g., dye precursor) and a photopolymerizable composition comprising an ethylenic vinyl compound and a photopolymerization initiator, exposing the thus-produced light-sensitive sheet imagewise to light for hardening the microcapsules in exposed portions, and pressing the sheet completely over surface together with a color-developer sheet placed in contact therewith for destructing the microcapsules in unexposed portions, whereby the color-image forming substance is transferred to the image receiving member (e.g., color developer layer) for color development. An example of such an image-forming system in which microcapsules are used, in the present invention is described greater detail in below.

The photopolymerizable composition according to the present invention may contain different additives used for various purposes. Thus, for example, it may contain a heat polymerization inhibitor, a color image forming substance (dye or dye precursor or pigment) and so forth.

Methods of producing light-sensitive materials using the photopolymerizable composition according to the present invention are described below.

While various methods can be used for producing light-sensitive materials, a general method comprises the steps of preparing a coating composition by dissolving, emulsifying and/or dispersing constituents of the light-sensitive layer in an appropriate solvent, then applying the coating composition to a support as mentioned above, and drying to give a light-sensitive material.

The polymerizable compound, one of the essential components of the photopolymerizable composition according to the invention, may be emulsified and, as a result, contained in droplet form in the light-sensitive layer, optionally followed by microencapsulation, namely enclosing the droplets within microcapsule walls. In that instance, the organoaluminum compound salt of organic cationic dye compound should preferably be also contained in the droplets.

The composition according to the invention can also be used for color image formation by adding a color image forming substance and, after polymerization, removing unpolymerized portions and causing polymerized portions to develop a color, or transferring unpolymerized portions to an image receiving member for color development.

Various color image forming substances can be used in the practice of the present invention. For example, dyes and pigments that are exemplary of such substances are those which are intrinsically colored. With these, it is possible to form color images by destroying portions where no high-molecular polymers are formed (microcapsules) and causing image transfer to an image-receiving material by an appropriate method. Examples of such dyes and pigments that are either commercially available or known are described in a number of references including, for example, "Senryo Binran (Manual of Dyes)", edited by the Society of Synthetic Organic Chemistry, Japan, published 1970; "Saishin Ganryo Binran (Manual of Pigments, Updated)", edited by Nippon Ganryo Gijutsu Kyokai (Japan Pigment Technology Association), published 1977. These dyes or pigments are used in solution or dispersion form.

On the other hand, the present invention can also be practiced with color image forming substances which are normally colorless, which can be classified into the following two categories: those which are normally colorless or pale-colored but can develop color upon application of some kind of energy such as heating, pressure application or light irradiation, and those which cannot develop color upon energy application but can develop color upon contact with another component (color developer). Examples of the former are thermochromic compounds, piezochromic compounds, photochromic compounds and leuco forms of triarylmethane dyes, quinone dyes, indigoid dyes, azine dyes and the like, among others. These take on color upon heating, application of pressure, irradiation with light, or oxidation with air.

The latter include various systems in which an acid-base reaction, oxidation-reduction reaction, coupling reaction or chelate-formation reaction or the like reaction between two or more components results in color development. Thus, for instance, use may be made of color development systems comprising a color former having a partial structure of lactone, lactam, spiropyran or the like and an acidic substance (color developer) as used in pressure-sensitive recording sheets or the like; systems in which the azo coupling reaction between an aromatic diazonium salt or diazotate or diazosulfonate and a naphthol, aniline, active methylene-containing compound or the like is utilized; chelate formation systems involving, for instance, the reaction of hexamethylenetetramine with ferric ion and gallic acid or the reaction between phenolphthalein-Complexon acid and an alkaline earth metal ion; oxidation-reduction systems involving, for instance, the reaction between ferric stearate and pyrogallol or the reaction between silver behenate and 4-methoxynaphthol.

As another example of the system in which color develops by a reaction between two components, a system is known in which this reaction proceeds upon heating. In this case, it is necessary that the two components be mixed following destruction of microcapsules by pressure and at the same time or immediately thereafter the two components are heated.

The color former in the color former/developer system includes, among others, (1) triarylmethane compounds, (2) diphenylmethane compounds, (3) xanthene compounds, (4) thiazine compounds and (5) spiropyran compounds. Those compounds described in JP-A-55-27253 represent specific examples thereof. Among them, (1) triarylmethane compounds and (3) xanthene compounds are preferred since many of them can afford high color densities with slight fogging. Typical examples are crystal violet lactone, 3-diethylamino- 6-chloro-7-(β-ethoxyethylamino)fluoran, 3-diethylamino-6-methyl-7-anilinofluoran, 3-triethylamino-6-methyl-7-anilinofluoran, 3-cyclohexylmethylamino-6-methyl-7-anilinofluoran and 3-diethylamino-7-o-chloroanilinofluoran. These compounds are used either singly or in combination.

The color developer includes phenolic compounds, organic acids and metal salts thereof, hydroxybenzoic acid esters and acid clay, among others.

Examples of the phenolic compounds include 4,4'-isopropylidenediphenol (bisphenol A), p-tert-butylphenol, 2,4-dinitrophenol, 3,4-dichlorophenol, 4,4'-methylenebis( 2,6-di-tert-butylphenol), p-phenylphenol, 1,1-bis(4-hydroxyphenyl)cyclohexane, 1,1-bis(4-hydroxyphenyl)-2-ethylhexane, 2,2-bis(4-hydroxyphenyl)butane, 2,2'-methylenebis( 4-tert-butylphenol), 2,2'-methylenebis(α-phenyl-p-cresol), thiodiphenol, 4,4'-thiobis(6-tert-butyl-m-cresol), sulfonylediphenol, a p-tert-butylphenol-formaldehyde condensate and a p-phenylphenol-formaldehyde condensate.

Examples of the organic acids or salts thereof are phthalic acid, phthalic anhydride, maleic acid, benzoic acid, gallic acid, o-toluic acid, p-toluic acid, salicylic acid, 3-tert-butylsalicylic acid, 3,5-di-tert-butylsalicylic acid, 5-α-methylbenzylsalicylic acid, 3,5-di(α-methylbenzyl)salicylic acid, 3-tert-octylsalicylic acid and the like, and zinc, lead, aluminum, magnesium and nickel salts thereof. Among them, salicylic acid derivatives and zinc and aluminum salts thereof are particularly superior to others in color developing ability, fastness of images formed and storability of recording sheets, among others.

Examples of the hydroxybenzoic acid esters include, for example, ethyl p-oxybenzoate, butyl p-oxybenzoate, heptyl p-oxybenzoate, benzyl p-oxybenzoate.

It is possible to combinedly use an oil-absorbing white pigment for attaining diffusion and immobilization of encapsulated substances.

For purposes of causing these color developers to melt at a desired temperature for a color development reaction, it is preferable to use the developers as eutectoids with a low-melting thermofusible substance or in a state coated with an once melted low-melting compound on the developer particle surface.

Typical examples of the low-melting substance include, but are not particularly limited to, higher fatty acid amides, such as stearamide, erucamide, palmitamide and ethylenebisstearamide, waxes, such as higher fatty acid esters, phenyl benzoate derivatives, aromatic ether derivatives and urea derivatives.

In another exemplary color former/developer system, the color former is, for example, phenolphthalein, fluorescein, 2',4',5',7'-tetrabromo-3,4,5,6-tetrachlorofluorescein, tetrabromophenol blue, 4,5,6,7-tetrabromophenolphthalein, eosine, aurincresol red, 2-naphtholphenolphthalein or the like.

As the developer, examples include inorganic and organic ammonium salts, organic amines, amides, (thio)urea and derivatives thereof, thiazoles, pyrroles, pyrimidines, piperazines, guanidines, indoles, imidazoles, imidazolines, triazoles, morpholines, piperidines, amidines, formamidines, pyridines and the like nitrogen-containing compounds. Typical examples of these are ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidinetrichloroacetate, N,N'-dibenzylpiperazine, 4,4'-dithiomorpholine, morpholinium trichloroacetate, 2-aminobenzothiazole and 2-benzoylhydrazinobenzothiazole.

In the practice of the invention, the color image forming substance is used generally in a proportion of 0.5 to 20 parts by weight, preferably 2 to 7 parts by weight, per 100 parts by weight of the polymerizable compound(s). The color developer is used generally in a proportion of about 0.3 to 80 parts by weight per 1.0 part by weight of the chromogen.

The photopolymerizable composition according to the invention can be microencapsulated by any method well known in the art. Thus, for instance, the following methods may be used; the method described in U.S. Pat. Nos. 2,800,457 and 2,800,458 which utilizes coacervation of hydrophilic wall forming materials; the interfacial polymerization method described in U.S. Pat. No. 3,287,154, British Patent No. 990,443 and JP-B-38-19574, JP-B-42-446 and JP-B-42-771; the method described in U.S. Pat. Nos. 3,418,250 and 3,660,304 which involves polymer deposition; the method described in U.S. Pat. No. 3,796,669 which uses isocyanate-polyol wall materials; the method described in U.S. Pat. No. 3,914,511 which uses isocyanate wall materials; the method described in U.S. Pat. Nos. 4,001,140, 4,087,376 and 4,089,802 which uses urea-formaldehyde or urea-formaldehyde-resorcinol wall forming materials; the method described in U.S. Pat. No. 4,025,455 which uses melamine-formaldehyde resins, hydroxypropylcellulose and the similar wall forming materials; the in situ method described in JP-B-36-9168 and JP-A-51-9079 which is based on polymerization of monomers; the electrolytic dispersion and cooling method described in British Patents 952,807 and 965,074; and the spray drying method described in U.S. Pat. No. 3,111,407 and British Patent 930,422. Usable methods are not limited to those mentioned above, but it is preferable that emulsification of the core substance be followed by formation of a macromolecule layer as the microcapsule wall.

In forming the microcapsule wall in the practice of the invention, the method which comprises causing polymerization of reactant(s) from within oil droplets and thereby attaining microencapsulation is particularly effective. This method can provide capsules which are uniform in grain size, outstanding in their unhardened state storability and particularly suited for use in recording material production, within a short period of time.

In cases where a polyurethane, for instance, is used as the capsule wall material, a polyisocyanate and a second substance capable of reacting therewith for capsule wall formation (e.g. polyol, polyamine) are mixed with an oily liquid to be microencapsulated, the oily mixture is emulsified/dispersed in water and then microcapsule wall formation is carried out by causing a highmolecule formation reaction on the droplet interface by raising the temperature. In this case, a low-boiling auxiliary solvent with potent solvent power may be used in the oily liquid.

In the capsule wall formation mentioned above, those polyisocyanates and counterpart polyols or polyamines which are disclosed in U.S. Pat. Nos. 3,281,383, 3,773,695 and 3,793,268, JP-B-48-40347 and JP-B-49-24159 and JP-A-48-80191 and JP-A-48-84086 may be used.

The polyisocyanate thus includes, among others, diisocyanates, such as m-phenylene diisocyanate, p-phenylene diisocyanate, 2,6-tolylene diisocyamate, 2,4-tolylene diisocyanate, naphthalene-1,4-diisocyanate, diphenylmethane-4,4'-diisocyanate, 3,3'-dimethoxy-4,4'-biphenyl-diisocyanate, 3,3'-dimethyldiphenylmethane-4,4'-diisocyanate, 1,4-xylylene diisocyanate, 4,4'-diphenylpropanediisocyanate, trimethylene diisocyanate, hexamethylene diisocyanate, 1,2-propylene diisocyanate, 1,2-butylene diisocyanate, 1,2-cyclohexylene diisocyanate and 1,4-cyclohexylene diisocyanate; triisocyanates, such as 4,4',4"-triphenylmethanetriisocyanate and toluene-2,4,6-triisocyanate; tetraisocyanates, such as 4,4'-dimethyldiphenylmethane-2,2',5,5'-tetraisocyanate; and isocyanate prepolymers, such as a hexamethylene diisocyanatetrimethylolpropane adduct, a 2,4-tolylene diisocyanatetrimethylolpropane adduct, a xylylene diisocyanatetrimethylolpropane adduct and a tolylene diisocyanatehexanetriol adduct.

The polyol includes aliphatic and aromatic polyhydric alcohols, hydroxy-terminated polyesters, hydroxy-terminated polyalkylene ethers, and the like.

The polyamine includes, among others, ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetetramine, diethylaminopropylamine, tetraethylenepentamine, and amine adducts derived from epoxy compounds. The polyamine is used preferably in an amount 0.02 to 2 moles as expressed in terms of the number of moles of active hydrogen per mole of the isocyanate group. The polyisocyanate may form a highmolecular substance also when it reacts with water.

In preparing microcapsules, a water-soluble highmolecular substance can be used. The water-soluble highmolecular substance may be a water-soluble anionic highmolecular substance, a water-soluble nonionic highmolecular substance or a water-soluble amphoteric highmolecular substance. The anionic highmolecular substance may be a naturally-derived one or a synthetic one and may contain a —COO— or —$SO_2$— group, for instance. Typical examples of the anionic natural macromolecule are gum arabic, alginic acid and pectin. Examples of the semisynthetic one are a carboxymethylcellulose, a phthalated gelatin, a sulfated starch, a sulfated cellulose and a ligninsulfonic acid.

As the synthetic anionic high molecular substance examples include maleic anhydride copolymers (inclusive of hydrolyzates), (meth)acrylic acid polymers and copolymers, vinylbenzenesulfonic acid polymers and copolymers and carboxy-modified polyvinyl alcohol, among others.

The typical example of the amphoteric high molecular suitable is gelatin.

These water-soluble macromolecules are Used in 0.01 to 10% by weight aqueous solution form. The microcapsule grain size is adjusted to 20 μm or less.

The capsules to be used in the practice of the invention have a size not greater than 80 μm, preferable not greater than 20 μm, in particular, from the storability and easy handling viewpoints. When capsules are excessively small, they may possibly disappear and became entrapped into holes of the substrate or into spaces among fibers. This possibility depends on the individual properties of the substrate or support being used. Therefore, while it is preferable that the capsule size be not less than 0.1 μm, this is not a universal requirement as the idiosyncracies of any given substrate or support member being used must be taken into consideration.

The capsules to be used in the practice of the present invention should preferably undergo no substantial changes at pressures below about 10 $kg/cm^2$, but should be frangible upon application of a pressure higher than about 10 $kg/cm^2$. The magnitude of the pressure required for capsule destruction can be varied according to the intended use and, therefore, is not limited to a particular threshold value. Generally, however, the destruction should preferably be effected at a pressure not higher than about 500 $kg/cm^2$. The pressure characteristics of capsules can be controlled by adjusting or selecting the capsule grain size, capsule wall thickness and wall materials to be used.

In encapsulating the polymerizable compound(s) and color image forming substance in the practice of the invention, a solvent maybe combinedly used. A solvent may be used also in introducing a reducing agent, the color developer and/or the like into capsules. It is also possible to apply a solution of such substances in water or a hydrophilic organic solvent, for instance, directly to the support, if necessary, together with a binder, for coating the support, or to introduce the solution into capsules by the known method as described in U.S. Pat. No. 2,322,027 or the like method. By using a solvent in microcapsules, it is possible to control the extent of capsule destruction on the occasion of pressure application and the transfer of the color image forming substance in capsules to the image acceptor element. The amount of the solvent to be used in capsules is preferably within the range of 1 to 500 parts by weight per 100 parts by weight of the polymerizable compound(s).

A natural or synthetic oil may be combinedly used as the solvent to be used in the practice of the present invention. Examples of such solvent are cotton seed oil, kerosene, aliphatic ketones, aliphatic esters, paraffins, napththene oils, alkylated biphenyls, alkylated terphenyls, chlorinated paraffins, alkylated napththalenes, diarylethanes (e.g., 1-phenyl-1-xylylethane, 1-phenyl-1-pethylphenylethane, 1,1'-ditolylethane), alkyl phthalates (e.g., dibutyl phthalate, dioctyl phthalate), phosphate esters (e.g., diphenyl phosphate, triphenyl phosphate, tricresyl phosphate, dioctyl butyl phosphate), citrate esters (e.g., tributyl acetylcitrate), benzoate esters (e.g., octyl benzoate), alkylamides (e.g., diethyllauramide), fatty acid esters (e.g., dibutoxyethyl succinate, dioctyl azelate), trimesate esters (e.g., tributyl trimesate), lower alkyl acetates (e.g., ethyl acetate, butyl acetate), ethyl propionate, secondary butyl alcohol, methyl isobutyl ketone, β-ethoxyethyl acetate, methylcellosolve acetate, cyclohexanone and the like.

The image receiving element, which is used together with a light-sensitive element containing the composition according to the present invention, is an element for causing coloring of and/or immobilizing the color image forming substance released from the light-sensitive microcapsules. The light-sensitive microcapsules and the image receiving elements may occur in the same layer on the same support, or in separate layers on the same support, or on separate supports, for example in a combination of a light-sensitive sheet having a layer containing light-sensitive microcapsules on a support and an image receiving sheet having a layer containing an image receiving element on a support.

In the practice of the present invention, the image receiving element may further contain, as necessary, an anionic or cationic polymer mordant or a combination of an anionic polymer and a cationic polymer, for instance.

The binder to be used in the light-sensitive material and image receiving material in practicing the present invention may be composed of a single species or two or more species in combination. Transparent or translucent binders are typical hydrophilic binders that are usable and include, among others, natural substances, such as gelatin, gelatin derivatives, cellulose derivatives, proteins, starch, gum arabic and other polysaccharides, and synthetic polymers, such as polyvinyl pyrrolidone, polyacrylamide and other water-soluble polyvinyl compounds. As other synthetic polymers, examples include dispersed vinyl compounds in latex form.

Furthermore, vinyl addition polymer binders soluble in organic solvents can be used as well.

Usable technics for coating respective coating compositions for forming a light-sensitive material layer and an image receiving material layer in the practice of the present invention include the use of, for example, a blade coater, rod coater, knife coater, roll doctor coater, comma coater, reverse roll coater, transfer roll coater, gravure coater, kiss roll coater, curtain coater or extruder coater. As regards the method of coating, reference can be made to Research Disclosure, vol. 200, December 1980, Item 20036 XV. An appropriate layer thickness is 0.1 μm to 50 μm.

Recording materials in which the photopolymerizable composition according to the invention is used can be used in various diverse fields. For instance, the recording materials according to the invention can be used in the fields of copiers, facsimiles, printers, labels, color proofs, overhead projectors, original drawing copiers and the like. Supports suited for supporting the light-sensitive material and image receiving material in the practice of the present invention include supports such as paper, coated paper, laminated paper and synthetic paper, such transparent films as polyethylene terephthalate films, cellulose triacetate films, polyethylene films, polystyrene films and polycarbonate films, sheets of metals such as aluminum, zinc and copper, and variously treated (e.g., surface treated, undercoated, metal vapor deposited) modifications of the support mentioned above. Those supports described in Research Disclosure, vol 200, December 1980, Item 20036 XVII can also be used. These supports may be provided with various layers as required; for example an antihalation layer on the front side and a slipping layer, antistatic layer, anticurling layer and/or adhesive layer, on the reverse side.

The light-sensitive material and image receiving material may further contain an antifoggant, fluorescent brightening agent, antifading agent, antihalation or antiirradiation dye, pigment (inclusive of a white pigment such as titanium oxide), coloring matter for adjusting the color of material or for coloring the material, heat polymerization inhibitor, surfactant, dispersed vinyl compound and other additives, as necessary.

Various means of light exposure can be used for the photopolymerizable composition according to the invention. Ordinary light sources, such as sunlight, tungsten lamps, mercury lamps, halogen lamps (e.g., iodine lamps), xenon lamps, CRT light sources, plasma light sources, fluorescent tubes and light-emitting diodes, can of course be used. In addition, use can be made of light sources suited for high-illuminance short-period recording, for example, stroboscopic tubes, flash lamps and lasers, and, furthermore, exposure means in which a microshutter array where an LCD (liquid crystal), PLZT (lanthanum-doped lead titanozirconate) or the like is utilized in combination with a linear or planar light source.

For image recording, various exposure methods can be used, for example, contact exposure of a lithographic film or the like with an original, enlargement exposure with a slide or liquid crystal image or the like, and reflection exposure using reflected light from an original. For multicolor recording, image recording may be repeated using lights differing in wavelength, which can be obtained by light source exchange or light filter exchange.

In the practice of the present invention, that layer which contains light-sensitive microcapsules may be heated before and/or during and/or after exposure for increasing the sensitivity.

The image-forming material according to the invention is described hereinbelow in detail.

Preferred organoaluminum compound anions usable in the image forming material according to the present invention have the following formula (I'):

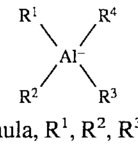

(I')

In the above formula, $R^1$, $R^2$, $R^3$ and $R^4$ may be the same or different and each is selected from the group consisting of an unsubstituted or substituted alkyl group, which may optionally have an unsaturated bond or bonds, an unsubstituted or substituted aryl group, an unsubstituted or substituted aralkyl group, an unsubstituted or substituted alkaryl group, an unsubstituted or substituted alkenyl group, an unsubstituted or substituted alkynyl group, an alicyclic group, an unsubstituted or substituted aryloxy group, an unsubstituted or substituted arylthio group, an unsubstituted or substituted arylamino group, an unsubstituted or substituted arylseleno group, an unsubstituted or substituted cycloalkyl group and an unsubstituted or substituted heterocyclic group; and two or more of $R^1$, $R^2$, $R^3$ and $R^4$ may be combined to form a cyclic structure. Examples of the substituents for the groups include, for example, an alkyl group having 1 to 16 carbon atoms, an alkyl group and a halogen atom. Examples of the heterocyclic group include ones containing nitrogen atom, sulfur atom, oxygen atom and/or selenium atom as the hetero atom(s).

Among these compounds, those compounds in which at least one of $R^1$, $R^2$, $R^3$ and $R^4$ is a group as defined by formulae (II), (III) or (IV) shown below have good stability, hence are preferred.

$$-X-R^5 \qquad (II)$$

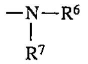

(III)

$$-N=R^8 \qquad (IV)$$

In the above formulae, X is an oxygen, sulfur or selenium atom; $R^5$, $R^6$ and $R^7$ may be the same or different and each is selected from the group consisting of a hydrogen atom, an alkyl or substituted alkyl group, an unsubstituted or substituted aryl group, an unsubstituted or substituted aralkyl group and an unsubstituted or substituted heterocyclic group; $R^6$ and $R^7$ may combinedly form a cyclic structure; and $R^8$ is an aliphatic, aromatic or heterocyclic group, which may optionally have one or more substituents. Examples of the substituents for the groups include, for example, an alkyl group having 1 to 16 carbon atoms, an alkyl group and a halogen atom. Examples of the heterocyclic group include ones containing nitrogen atom, sulfur atom, oxygen atom and/or selenium atom as the hetero atom(s).

Among the groups as defined by formulae (II), (III) and (IV), the group defined by formula (II) is preferred and the group defined by formula (II) in which X is an oxygen atom and $R^5$ is an unsubstituted or substituted aryl group is more preferred.

Among the organoaluminum compound anion according to the present invention, those are preferred in which at least one of the four substituents on the aluminum atom is a substituted hydroxy, substituted mercapto, substituted seleno or substituted amino group, most preferably an aryloxy group.

In cases where $R^1$, $R^2$, $R^3$ and $R^4$ in the above formula (I') are all different than the groups of the above formulae (II) to (IV), an alkyl group of 1 to 20 carbon atoms, which may optionally contain an unsaturated bond or bonds, an aryl group of 6 to 20 carbon atoms and an aralkyl group of 7 to 20 carbon atoms are preferred as the substituents Where $R^1$, $R^2$, $R^3$ and $R^4$ are alkyl groups, any two of them may be combined to each other to form a hetero atom-containing ring.

Particularly preferred as R, $R^2$, $R^3$ and $R^4$ are an alkyl group of 1 to 10 carbon atoms, which may contain an unsaturated bond or bonds, an aryl group of 6 to 10 carbon atoms and an aralkyl group of 7 to 10 carbon atoms.

Among the substituents represented by $R^5$ in the above formula (II), an aryl group is preferred. The term "aryl group" as used herein includes within the meaning thereof aromatic rings which may optionally contain a hetero atom or atoms, among which the benzene ring is particularly preferred. For providing the organoaluminum compound anion of formula (I') with stability, it is preferable that the aryl group be substituted in position 2 (relative to X in the above formula (II)). The aryl group may further be nuclearly substituted. Preferred as the substituent(s) in such case are an alkyl group of 1 to 20 carbon atoms, which may optionally contain an unsaturated bond or bonds, an aryl group of 6 to 20 carbon atoms, an alkoxy group of 1 to 20 carbon atoms, an aryloxy group of 6 to 20 carbon atoms, a halogen atom and an alkoxycarbonyl group of 2 to 20 carbon atoms, for example. Particularly preferred is an alkyl group of 1 to 10 carbon atoms, more preferably such an alkyl group containing a tertiary carbon atom in position alpha (α) relative to the benzene ring. The substituent(s) may serve as a linking group(s) to be bound to $R^1$, $R^2$, $R^3$ $R^4$, for or instance.

Among the substituents represented by X in the above formula (II), the oxygen atom is preferred.

Preferred among the substituents represented by $R^6$ and $R^7$ in the above formula (III) are an alkyl group of 1 to 20 carbon atoms, which may optionally contain an unsaturated bond or bonds and an aryl group of 6 to 20 carbon atoms. When $R^1$, $R^2$, $R^3$ and $R^4$ are alkyl groups, any two of them may combinedly form a hetero atom-containing ring.

While it is possible to obtain a photopolymerization-based image forming material using a composition containing an organoaluminum compound anion salt having the above structure and a radical-polymerizable compound, as mentioned above, the image forming material according to the invention utilizes photo-bleaching reaction of a dye and, therefore, the presence of a radical-polymerizable compound is not essential.

Preferred photobleachable dyes are cationic dyes and nonionic dyes.

When cationic dyes are used, they may serve simultaneously as the counter ions for the aluminum compound anions.

In that case, organic cationic dyes selected from among those specified below may be used either singly or in combination: cationic methine or polymethine dyes, preferably cyanine dyes, hemicyanine dyes, styryl dyes and azamethine dyes, more preferably such dyes having at least one indolenine or benzoselenazole structure; carbonium dyes, preferably triarylmethane dyes; pyrylium compounds, preferably pyrylium dyes and thiapyrylium dyes; quinonimine dyes, preferably azine dyes, thiazine dyes and oxazine dyes; xanthene dyes, preferably rhodamine dyes; acridine dyes; azulenium dyes; and the like.

Furthermore, organic cationic dyes which fall under the above categories and are either commercially available or known in the art can be used in the practice of the invention. For examples of these dyes, reference may be made to the section "Enkisei Senryo (Basic Dyes)" in "Senryo Binran (Manual of Dyes)" edited by the Organic Chemical Society of Japan; T. H. James: "The Theory of the Photographic Process", Macmillan Publishing Co., Inc., 1977, pages 194–290; "Kinosei Shikiso no Kagaku (Chemistry of Functional Dyes)", CMC Shuppansha, 1981, pages 1–32, 189–206 and 401–413; JP-A-59-189340; and EP-A-223587, among others.

Among the above-mentioned dyes, cyanine dyes and xanthene dyes are particularly useful in the practice of the present invention. Examples of such cyanine dyes are dyes of the following formula (VI):

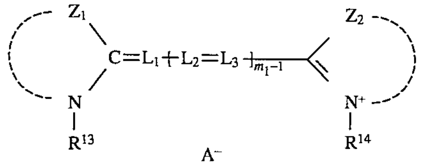

(VI)

In the above formula, $Z_1$ and $Z_2$ each independently is a group of atoms which is necessary for the completion of a heterocyclic nucleus generally used in cyanine dyes, preferably a thiosole, thiazoline, benzothiazole, naphthothiazole, oxazole, oxazoline, benzoxazole, naphthoxazole, tetrazole, pyridine, quinoline, imidazoline, imidazole, benzimidazole, naphthoimidazole, selenazoline, selenazole, benzoselenazole, naphthoselenazole or indolenine nucleus or the like. The nucleus may be substituted by one or more substituents each independently selected from the group consisting of an alkyl group of 1 to 4 carbon atoms, a halogen atom, an aryl group of 6 to 12 carbon atoms, a hydroxyl group, an alkoxy group of 1 to 4 carbon atoms, a carboxyl group, an alkoxycarbonyl group, an alkylsulfamoyl group, an alkylcarbamoyl group, an acetyl group, an acetoxy group, a cyano group, a trichloromethyl group, a trifluoromethyl group, a nitro group and the like.

$L_1$, $L_2$ or $L_3$ is a methine group or a substituted methine group. Preferred as the substituted methine group are methine groups substituted by an alkyl group of 1 to 4 carbon atoms, an unsubstituted or substituted aryl group of 6 to 12 carbon atoms, an alkoxy group of 1 to 4 carbon atoms, an aralkyl group of 7 to 12 carbon atoms or the like.

$L_1$ and $R^{13}$ and/or $L_3$ and $R^{14}$ may combinedly form a ring through an alkylene crosslink. A 5- or 6-membered ring is preferred as the ring.

The coefficient $m_1$ is an integer of 1 to 4. When $m_1$ is 2 to 4, namely when the unit $[L_2{=}L_3]$ occurs repeatedly, one $L_2$ and the neighboring $L_2$ may combinedly form a ring.

$R^{13}$ and $R^{14}$ each independently is an unsubstituted alkyl group (preferably of 1 to 8 carbon atoms) or a substituted alkyl group. As the substituent for the alkyl group, examples include an alkyl group of 1 to 8 carbon atoms, a halogen atom, an aryl group of 6 to 12 carbon atoms, an aralkyl group of 7 to 12 carbon atoms, a hydroxyl group, a carboxyl group, a sulfo group and an alkoxy group of 1 to 4 carbon atoms, for instance. The alkylene moiety of said substituted alkyl group preferably contains 1 to 5 carbon atoms. As examples of the substituted alkyl group, there may be mentioned β-sulfoethyl, γ-sulfopropyl, γ-sulfobutyl, δ-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3-tetrafluoropropyl, 3,3,3-trifluoroethyl, allyl and other substituted alkyl groups generally used as the N-substituents in cyanine dyes.

$A^-$ is the organoaluminum compound anion moiety in the above structural formula (I').

Dyes of the following formula (VII), for instance, are provided as specific examples of the xanthene dyes useful in the practice of the present invention.

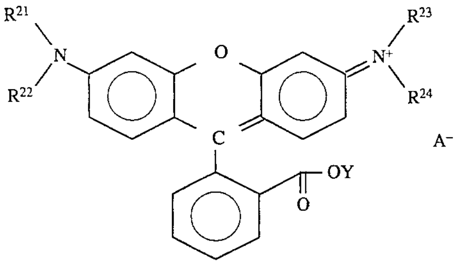
(VII)

In the above formula, $R^{21}$, $R^{22}$, $R^{23}$ and $R^{24}$ each independently is a hydrogen atom or an alkyl group, an alkoxy group, an aralkyl group or aryl group, preferably an alkyl group of 1 to 8 carbon atoms or an aryl group of 6 to 10 carbon atoms, an alkoxy group of 1 to 8 carbon atoms, an aralkyl group of 7 to 12 carbon atoms or the like.

$R^{21}$, $R^{22}$, $R^{23}$ and $R^{24}$ may optionally have at least one substituent, preferably a halogen atom or an alkyl, aryl, alkoxy, aryloxy, alkylthio, arylthio, carboxyl, acylcarbonyl, alkylsulfamoyl, alkylcarbamoyl, acetyl, acetoxy, cyano, trichloromethyl, trifluoromethyl or nitro group or the like.

$A^-$ is the organoaluminum compound anion found in the above formula (I') and Y is a hydrogen atom, an alkyl or aryl group or an alkali metal.

The photobleachable dyes may be nonionic ones. The nonionic dyes include, among others, merocyanine dyes, coumarin dyes, xanthene dyes and thiaxanthene dyes. For examples of the nonionic dyes, reference may be made, for example, to T. H. James: "The Theory of the Photographic Process", Macmillan Publishing Co., Inc., 1977, pages 194–290; and "Kinosei Shikiso no Kagaku (Chemistry of Functional Groups)", CMC Shuppansha, 1981, pages 1–32, 243-266 and 403–405.

Furthermore, any of other known nonionic dyes can be used. Typical examples are nonionic dyes described in JP-A-1-138204, 3-ketocoumarin compounds described in JP-A-58-15503 (corresponding to U.S. Pat. No. 4,505,793), naphthothiazole merocyanine compounds described in JP-B-59-28328 and JP-B-60-53300 and merocyanine compounds described in JP-B-61-9621 and JP-B-62-3842 and JP-A-59-89303 (corresponding to U.S. Pat. No. 4,481,276) and JP-A-60-60104.

When a nonionic dye is used as the photobleachable dye, it is preferable that a cationic compound be used as the counter ion to the aluminum compound anion.

Such cationic compound is preferably an organic cationic compound, more preferably one of the cationic dyes mentioned hereinabove or a quaternary ammonium salt.

It is also possible to use the quaternary ammonium salt in admixture with a cationic dye.

The above-mentioned organoaluminum compound anions of formula (I') may be prepared by uniformly mixing an organic cationic salt with an organoaluminum compound anion salt in an organic solvent. They may be used either as prepared or after isolation and purification.

As preferred examples of the organic cationic dye moiety, quaternary ammonium moiety and organoaluminum compound anion moiety that are usable in the practice of the present invention, the organic cationic dye moieties (D-Nos.), quaternary ammonium salt moieties (T-Nos.) and organoaluminum compound anion moieties (A-Nos.), respectively, of the aluminate complexes mentioned hereinabove are exemplary.

As the preferred compounds usable in the image-forming materials according to the present invention, examples thereof include salts resulting from arbitrary combination of any of the organic cationic dye moieties and/or any of the quaternary ammonium salt moieties on one hand and, on the other, any of the organoaluminum compound anion moieties. However, such salts are by no means limitative of the scope of the present invention.

The organoaluminum compounds according to the present invention can be synthesized by various methods. For example, they can be synthesized by reacting a trialkylaluminum, which is known to be inexpensive, with a phenol compound, then reacting the resulting dialkyl-pheoxyaluminum or monoalkyl-diphenoxyaluminum with an alkyllithium and further exchanging the counter ion for a quaternary ammonium. Furthermore, counter ion exchange between this quaternary salt of organoaluminum compound anion and a halide salt of a cationic dye gives the corresponding organoaluminum compound anion salt of an organic cationic dye compound.

In the image-forming material according to the present invention, it is preferable that the organoaluminum compound anion be present in excess relative to the photobleachable dye, namely in an amount of 1.0 to 10 moles, more preferably 1.2 to 10 moles, per mole of the dye.

The image-forming material according to the present invention can be produced in various forms according to the intended used thereof.

In a preferred form, a layer containing minute droplets of a composition containing the photobleachable cationic dye-organoaluminum compound anion salt according to the present invention or the photobleachable nonionic dye plus organoaluminum compound anion salt is formed on a support. In this case, the droplets may be the core substance in microcapsules. The layer also may contain a binder.

For producing a multicolor image-forming material, droplets or microcapsules containing photobleachable dyes differing in hue may be used in admixture, or a multilayer recording material may be produced with different layers containing photobleachable dyes different in hue, for instance. In this case, an intermediate layer may be provided between two neighboring layers, as necessary. Furthermore, a protective layer may be provided as the uppermost layer of the material.

The present invention is further described below, taking as an example, an image-forming material comprising a support provided thereon a layer(s) containing a photobleachable dye(s) in a binder.

While the image forming material according to the present invention can be produced by various methods, a general usable method comprises the steps of preparing a coating composition by dissolving, emulsifying or dispersing the constituents of the photobleachable dye layer in an appropriate solvent, then coating the composition on to a support such as mentioned above, and drying the whole to give an image forming material.

In the practice of the present invention, the photobleachable dye can be microencapsulated by any of the methods known in the art, for example by the methods mentioned hereinabove with reference to the microencapsulation of the photopolymerizable composition according to the present invention.

In the practice of the present invention, the photobleachable dye layer may optionally contain a macromolecular binder. Usable examples of the highmolecular binder are those natural and synthetic polymers and polymer latexes that are known in the art. Examples are gelatin, polyvinyl alcohol, hydroxyethylcellulose, polyvinylpyrrolidone, casein, starch and other water-soluble highmolecule substances; polystyrene, polyvinyl formal, polyvinyl butylal, acrylic resins (e.g., polymethyl acrylate, polybutyl acrylate, polymethyl methacrylate, polybutyl methacrylate, and copolymers of these), phenolic resins, styrene-butadiene resins, ethylcellulose, epoxy resins, urethane resins and other solvent-soluble highmolecule substances as well as polymer latexes based on these.

When a protective layer is provided in the practice of the present invention, the protective layer preferably contain a matting agent. As the matting agent, examples include, among others, silica, magnesium oxide, barium sulfate, strontium sulfate, silver halides and the like inorganic compounds; particle of polymers such as polymethyl methacrylate, polyacrylonitrile and polystyrene; and starch particles such as carboxystarch, corn starch and carboxynitrophenylstarch. These matting agents preferably have a particle size of 1 to 20 μm. Among these matting agents, polymethyl methacrylate particles and silica particles are particularly preferred. Preferred grades of silica particles are, for example, Syloid AL-1, 65, 72, 79, 74, 404, 620, 308, 978, 161, 162, 244, 255, 266 and 150 (trade names, products of Fuji-Devison Chemical Ltd.). The matting agent is used preferably at an addition level of 2 to 500 mg/m², more preferably 5 to 100 mg/m².

In the practice of the present invention, a hardener should preferably is used in respective layers of the recording material according to the present invention, for example, the photobleachable dye layer(s), intermediate layer(s) and protective layer. Useful as the hardener are "gelatin hardeners" used in the production of photographic light-sensitive materials. Thus, for example, use may be made of aldehydes, such as formaldehyde and glutaraldehyde; reactive halogen-containing compounds as described, for example, in U.S. Pat. No. 3,635,718; compounds having a reactive ethylenenic unsaturated bond as described, for example, in U.S. Pat. No. 3,635,718; aziridine compounds as described, for example, in U.S. Pat. No. 3,017,280; epoxy compounds, halogenated carboxyaldehydes (e.g., mucochloric acid) and dioxanes (e.g., dihydroxydioxane, dichlorodioxane) as described, for example, in U.S. Pat. No. 3,091,537; vinyl sulfones as described in U.S. Pat. Nos. 3,642,486 and 3,687,707; vinyl sulfone precursors as described in U.S. Pat. No. 3,841,872; ketovinyls as described in U.S. Pat. No. 3,640,720; and inorganic hardeners such as chrome alum, zirconium sulfate and boric acid. Among these hardeners, the following compounds are particularly preferred: 1,3,5-triacryloylhexahydro-s-triazine, 1,2-bisvinylsulfonylmethane, 1,3-bis(vinylsulfonylmethyl)propanol-2, bis(α-vinylsulfonylacetamido)ethane, 2,4-dichloro-6-hydroxy-s-triazine sodium salt, 2,4,6-triethylenimino-s-triazine and boric acid. The hardener is used preferably in an amount of 0.5 to 5% by weight based on the binder.

The protective layer may further contain colloidal silica so that the tackiness thereof can be reduced. Preferred grades of colloidal silica are, for instance, Snowrex 20, Snowtex 30, Snowtex C, Snowtex O and Snowtex N (trade names, products of Nissan Chemical Industries Co., Ltd.). Colloidal silica is added preferably in an amount of 5 to 80% by weight based on the binder amount.

Furthermore, the protective layer may contain a fluorescent brightening agent for increasing the whiteness of the image forming material according to the present invention. The protective layer may further contain a blue dye as a blueing agent.

In cases where the image-forming material according to the present invention is designed for multicolor imaging, the material may have a multilayer constitution such that a plurality of layers containing respective photobleachable dyes differing in hue are superposed, with an ultraviolet absorber-containing intermediate layer between each two neighboring dye layers.

In that case, each intermediate layer is mainly composed of a binder and an ultraviolet absorber, and if necessary, with a hardener and/or an additive or additives (e.g., polymer latex) added.

As the ultraviolet absorber, examples include those known in the art, inclusive of benzotriazole compounds, cinnamate ester compounds, aminoarylidenemalononitrile compounds and benzophenone compounds.

The ultraviolet absorber to be used in the practice of the present invention can be added to any layer as desired, and in particular, to each intermediate layer, by emulsification/ dispersion by the oil drop-in-water dispersion method or polymer dispersion method. According to the oil drop-in-water dispersion method, the ultraviolet absorber is dissolved in a high-boiling organic solvent with a boiling point not lower than 175° C. or a relatively low-boiling solvent with a boiling point of 30° C. to 160° C. (so-called "auxiliary solvent"), or a mixture of these, and the resulting solution is then finely dispersed in an aqueous medium, such as water, an aqueous solution of gelatin or an aqueous solution of polyvinyl alcohol, in the presence of a surfactant. Examples of the high-boiling organic solvent are described, for example, in U.S. Pat. No. 2,322,027. Furthermore, those solvents specifically mentioned hereinbefore for encapsulation can preferably be used as the high-boiling organic solvent and auxiliary solvent. The dispersion process may be accompanied by phase inversion. In necessary, the auxiliary solvent may be removed or reduced in quantity by distillation washing with water by noodling or by ultrafiltration prior to coating of the dispersion. The latex dispersion method may also be employed with reference to U.S. Pat. No. 4,199,363, West German Patent Applications (OLS) Nos. 2,541,274 and 2,541,230, JP-A-49-74538, JP-A-51-59943 and JP-A-54-32552 or Research Disclosure, vol. 148, August 1976, Item 14850, for instance.

Preferred ultraviolet absorber suited for use in the practice of the present invention are those ultraviolet absorbers that have a structure rendering them substantially indiffusible into neighboring layers, for example, polymers copolymerized with an ultraviolet absorbers or latexes containing such polymers. For examples of such ultraviolet absorbers, reference may be made to European Patent 127,819, JP-A-59-68731 (corresponding to U.S. Pat. No. 4,551,420), JP-A-59-26733 (corresponding to U.S. Pat. No. 4,645,733) and JP-A-59-23344 (corresponding to U.S. Pat. No. 4,464,462), British Patent 2,118,315, JP-A-58-111942 (corresponding to U.S. Pat. No. 4,431,726), U.S. Pat. Nos. 4,307,184, 4,202,836, 4,202,834, 4,207,253 and 4,178,303 and JP-A-47-560, among others.

These ultraviolet absorbers may be added not only to the intermediate layers but also to a protective layer, photobleachable dye layers, an antihalation layer(s) and/or some other layer or layers.

In the practice of the present invention, dispersion and encapsulation of the photobleachable dyes themselves, or oils with photobleachable dyes dissolved therein, or fixing agents and so on are preferably carried out in the presence of a water-soluble polymer. In the practice of the present invention, water-soluble polymers whose solubility in water at 25° C. is not less than 5% by weight are preferred and, as specific examples, examples include gelatin, gelatin derivatives, proteins (e.g., albumin, casein), cellulose derivatives (e.g., methylcellulose, carboxymethylcellulose), sodium alginate, starches (inclusive of modified starches), similar sugar derivatives, gum arabic, polyvinyl alcohol, hydrolyzates of styrene-maleic anhydride copolymers, carboxy-modified polyvinyl alcohol, polyacrylamide, saponified products of vinyl acetate-polyacrylic acid copolymers, polystyrenesulfonic acid salts and similar synthetic highmolecular substances. Among these, gelatin and polyvinyl alcohol are preferred.

The binders to be used in various layers of this image forming material, namely the protective layer, photobleachable dye layer(s), intermediate layer(s), etc., may be the above-mentioned water-soluble highmolecular substances as well as solvent-soluble highmolecular substances, such as polystyrene, polyvinyl formal, polyvinyl butyral, acrylic resins (e.g., polymethyl acrylate, polybutyl acrylate, polymethyl methacrylate, polybutyl methacrylate or copolymers of them), phenol resins, styrene-butadiene resins, ethylcellulose, epoxy resins and urethane resins, and latexes containing such highmolecular substances Among these, gelatin and polyvinyl alcohol are preferred.

The layers of the image-forming material, for example the photobleachable dye layer(s), as produced in accordance with the present invention may contain one or more of various surfactants for various purposes, for example as coating auxiliaries or antistatic agents, for improving slip characteristics, for emulsification/dispersion or for preventing adhesion.

Surfactants which are usable as necessary include nonionic surfactants, such as saponins, polyethylene oxide, polyethylene oxide alkyl ethers, similar polyethylene oxide derivatives; anionic surfactants, such as alkylsulfonic acid salts, alkylbenzenesulfonic acid salts, alkylnaphthalenesulfonic acid salts, alkylsulfuric acid salts, N-acyl-N-alkyltaurines, sulfosuccinate ester salts and sulfoalkylpolyoxyethylene alkylphenyl ether salts; amphoteric surfactants, such as alkylbetaines and alkylsulfobetaines; and cationic surfactants, such as aliphatic or aromatic quaternary ammonium salts.

The image-forming material according to the present invention may contain various additives, inclusive of those mentioned hereinbefore, as necessary. Typical examples of antiirradiation or antihalation dyes, ultraviolet absorbers, plasticizers, fluoresant brightening agents, matting agents, coating auxiliaries, hardeners, antistatic agents and slip characteristics modifiers, for instance, are described in Research Disclosure, vol. 176, December 1978, Item 17643 and ibid., vol. 187, November 1979, Item 18716.

For fixing images produced using the organoaluminum anion according to the present invention, the method using an acid, typically acetic acid or stearic acid, as described in U.S. Pat. No. 4,307,182 or the photobleaching method using a colorless second bleachable dye, as described in European Patent 109,772, may be used.

In the practice of the present invention, a coating composition(s) for a photobleachable dye layer(s) and coating compositions for other respective layers mentioned above are prepared, using a solvent(s) as necessary, and coated onto a desired support. The subsequent drying gives an image-forming material according to the present invention. As solvents usable in that case, examples include water, alcohols (e.g., methanol, ethanol, n-propanol, isopropanol, n-butanol, sec-butanol, methylcellosolve, 1-methoxy-2-propanol), halogenated solvents (e.g., methylene chloride, ethylene chloride), ketones (e.g., acetone, cyclohexanone, methyl ethyl ketone), esters (e.g., methylcellosolve acetate, ethyl acetate, methyl acetate), toluene and xylene, among others. These solvents may be used either alone or as a mixture of two or more of them. Among these, water is particularly preferred.

Usable technics for coating the coating compositions for forming respective layers on the support include the use of, for example, a blade coater, rod coater, knife coater, roll doctor coater, comma coater, reverse roll coater, transfer roll coater, gravure coater, kiss roll coater, curtain coater or extrusion coater. For methods of coating, reference may be made to Research Disclosure, vol. 200, December 1980, Item 20036 XV. μm appropriate recording layer thickness is 0.1 μm to 50 μm.

The image forming material according to the present invention can be used in various fields. Thus, for instance, it can be used in the fields of copiers, facsimiles, printers, labels, color proofs, overhead projectors, copied original drawings, and so forth. Suitable supports for the material are include supports such as paper, coated paper, laminated paper and synthetic paper, such transparent films as polyethylene terephthalate, cellulose triacetate, polystyrene and polycarbonate films, sheets of metals such as aluminum, zinc and copper, and variously treated (e.g., surface treated, undercoated, metal vapor deposited) modifications of the supports mentioned above. Those supports described in Research Disclosure, vol. 200, December 1980, Item 20036 XVII can also be used. These supports may be provided with various layers as required; for example, an antihalation layer on the front side and a slipping layer, antistatic layer, anticurling layer and/or adhesive layer, on the reverse side.

Various means of light exposure can be used for the image-forming material according to the present invention. Ordinary light sources, such as sunlight, tungsten lamps, mercury lamps, halogen lamps (e.g., iodine lamps), xenon lamps, CRT light sources, plasma light sources, fluorescent tubes, light-emitting diodes, can of course be used. In addition, use can be made of light sources suited for high-illuminance short-period recording, for example, stroboscopic tubes, flash lamps and lasers, and, furthermore, exposure means in which a microshutter array where an LCD (liquid crystal), PLZT (lanthanum-doped lead titanozirconate) or the like is utilized in combination with a linear or planar light source.

For image recording, various exposure methods can be used, for example, contact exposure of a lithographic film or the like with an original, enlargement exposure with a slide or liquid crystal image or the like, and reflection exposure using reflected light from an original. For multicolor recording, image recording may be repeated using lights differing in wavelength, which can be obtained by light source exchanges or light filter exchanges.

With the image forming material according to the invention, which can be produced using inexpensive starting materials and is of the monosheet type requiring no unnecessary materials, vivid multicolor images can be obtained in an easy and simple manner by mere image exposure.

The following examples are further illustrative of the present invention but are by no means limitative of the scope of the invention.

EXAMPLE 1

To 80 ml of dehydrated toluene solution containing 4.4 g of tri-n-butylaluminum was added dropwise a solution of 9.5 g of 2,6-di-tert-butylphenol in 10 ml of dehydrated toluene over a period of about 15 minutes at room temperature. The temperature was gradually raised to the toluene refluxing temperature over a timespan of about 1 hour. The mixture was then stirred under reflux for 1 hour. The solvent was distilled off and then unreacted 2,6-di-tert-butylphenol was distilled off under reduced pressure. The thus-obtained mixture of bis(2,6-di-tert-butylphenoxy)-n-butylaluminum and tri-n-butylaluminum weighed 8.8 g.

Dehydrated toluene (100 ml) was added to the above mixture. Thereto was added dropwise and gradually 11 ml of a solution of 1.15 g of n-butyllithium in n-hexane with ice bath cooling for maintaining the inside temperature at 5° C. or below. The resultant mixture was stirred at 0° C. for 1 hour and then at room temperature for 1 hour. The solvent was distilled off and 100 ml of dehydrated toluene was added, whereupon a hexane-insoluble lithium salt precipitated out. This was recrystallized from n-hexane-toluene to give 5.5 g of lithium bis(2,6-di-tert-butylphenoxy)-di-n-butylaluminate.

The above lithium salt was dissolved in 50 ml of dehydrated dichloromethane, a solution of 12.8 g of tetra-n-butylammonium chloride in 10 ml of dichloromethane was added at room temperature, and the mixture was stirred at the same temperature for 1 hour. The resultant dichloromethane-insoluble lithium chloride was filtered off and the filtrate was concentrated to give 7.1 g of an aluminate complex composed of compound (A-1) and compound (T-2) described hereinafter.

The structure of compound (A-1) was confirmed by NMR spectrometry.

One drop of a solution composed of 0.08 g of the aluminate complex, 2 g of dichloromethane, 7 g of trimethylolpropane triacrylate and 0.07 g of the above-mentioned dye compound (D-7) in the iodine salt form, described hereinafter, was placed on a polyethylene terephthalate film (100 μm thick) and another polyethylene terephthalate film was further placed thereon to give a sample. This was set in a vacuum printing frame and exposed to 0.1 count of light under vacuum using a jet light device (manufactured by ORC Co., Ltd.; 1KW), whereupon the sample was photocured, undoubtedly giving a readily discernable polymerization product.

EXAMPLE 2

The photopolymerizable composition solutions S-1 to S-3 specified below in Table 1 were prepared.

One drop of any of the solutions S-1 to S-3 was placed on a polyethylene terephthalate film (100 μm thick) and another polyethylene terephthalate film was placed thereon to give a sample.

The samples thus prepared were each set in a vacuum printing frame and exposed to 0.1 count of light under vacuum using a jet light device (manufactured by ORC Co., Ltd.; 1 KW), whereupon samples S-2 and S-3 were photocured.

The result of S-3 made it evident that the organic cationic dye compound-organoaluminum compound anion salt according to the present invention has photopolymerization initiating ability. The result of S-2 made it further evident that the mixture of the iodine salt of the organic cationic dye compound and the tetrabutylammonium salt of the organoalumminum compound anion also has photopolymerization initiating ability and is comparable in the ability to the organic cationic dye compound-organoaluminum compound anion complex presumably because the mixture can form the complex in the solution.

TABLE 1

| | Formulations of photopolymerizable composition solutions | | |
|---|---|---|---|
| | S-1 (g) | S-2 (g) | S-3 (g) |
| Methylene chloride | 2 | 2 | 2 |
| Iodine Salt of Dye Compound (D-7) | 0.07 | 0.07 | |
| Photopolymerization initiator (A-1) + (T-1) | | 0.08 | |
| Photopolymerization initiator (A-1) + (D-7) | | | 0.11 |
| Monomer (M) | 7 | 7 | 7 |

Note; Monomer (M): Trimethylolpropane triacrylate

Salt of dye compound (D-7):

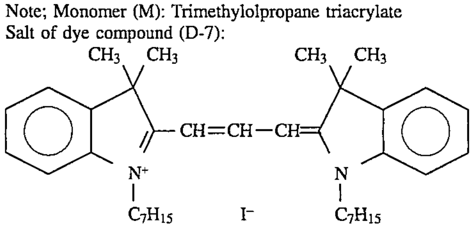

Photopolymerization initiator (A-1) + (T-1):

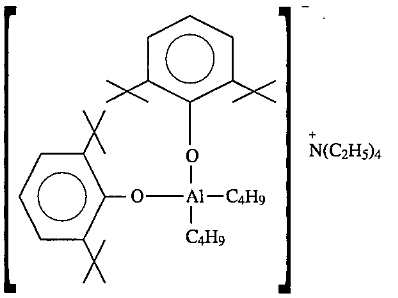

Photopolymerization initiator (A-1) + (D-7):

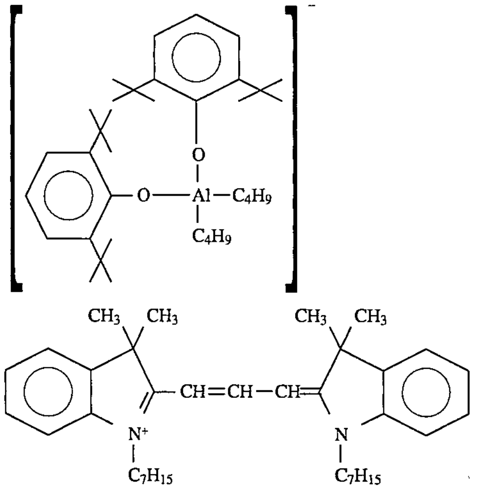

EXAMPLES 3 AND 4

Photopolymerizable compositions (C-1) and (C-2) were prepared using photopolymerization initiator solutions B-1 and B-2 (specified below in Table 2), respectively.

| [Photopolymerizable composition] | |
|---|---|
| Pentaerythritol tetraacrylate | 1.0 g |
| Benzyl methacrylate/methacrylic acid (73/27 mole ratio copolymer) | 0.8 g |
| Acetone | 5 g |
| Methyl ethyl ketone | 10 g |
| Propylene glycol monomethyl ether acetate | 5 g |
| Photopolymerization initiator solution (specified in Table 2) | x g |

TABLE 2

| Photopolymerization initiator solutions | B-1 (g) | B-2 (g) |
|---|---|---|
| Acetone | 6 | 6 |
| Iodine Salt of Dye Compound (D-7) | | 0.07 |
| Iodine Salt of Dye Compound (D-8) | | 0.07 |
| Photopolymerization initiator (A-1) + (T-1) | 0.08 | 0.08 |

Salt of dye compound (D-8):

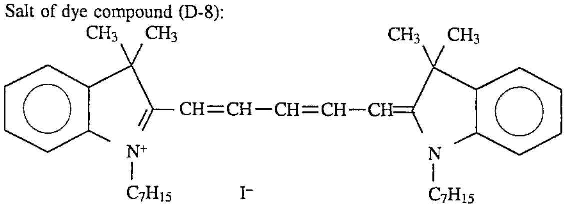

The thus-obtained photopolymerizable composition C-1 or C-2 was coated on to a polyethylene terephthalate film (100 μm thick) to give a coat layer thickness of 2 μm and dried at 100° C. for 2 minutes. Then the overcoat layer coating composition specified below was further coated on to a thickness of 1 μm and dried at 100° C. for 2 minutes to give a light-sensitive sheet (sheet 1 or 2, respectively).

| (Overcoat layer coating composition) | |
|---|---|
| Water | 98 g |
| Polyvinyl alcohol | 1.7 g |
| Hydroxypropylmethylcellulose | 1.7 g |
| Polyvinylpyrrolidone | 8.7 g |

Exposure was carried out using a vacuum printing frame apparatus. The above-mentioned light-sensitive sheets 1 and 2 were exposed to light from an extrahigh pressure mercury lamp using a jet light device (manufactured by ORC Co., Ltd: 1 KW) and via a step wedge [density difference per step: 0.15; density steps Nos. 0 to 15; Fuji Step Guide P (trade name, manufactured by Fuji Photo Film Co., Ltd.)]. After exposure, development was conducted using a developer having the following composition.

| (Developer) | |
|---|---|
| Anhydrous sodium carbonate | 10 g |
| Butylcellosolve | 5 g |
| Water | 1 g |

After development, those portions of the photopolymerizable composition which corresponded to wedge steps of less light exposures were dissolved out and the corresponding portions of the polyethylene terephthalate surface became bare. The highest step number relative to the step wedge at which the polyethylene terephthalate surface was not made bare was taken as a measure for evaluating the light-sensitive material. In this evaluation system, a higher step number means a higher sensitivity. The results obtained are shown below in Table 3.

TABLE 3

| Results of evaluation | | | |
|---|---|---|---|
| | Initiator solution | Step number | Maximum absorption wavelength of light-sensitive sheet |
| 1 | B-1 | 6 | 550 nm |
| 2 | B-2 | 5 | 650 nm |

The data shown in Table 3 indicate that the photopolymerizable compositions according to the invention have high sensitivity.

EXAMPLE 5

The photopolymerization initiator solutions F-1 or F-2 (specified below in Table 4) was mixed with a solution of 8.4 g of Perscript Red I-6-B (trade name, manufactured by Ciba-Geigy) in 35 g of trimethylolpropane triacrylate. The mixed solution was added to a mixture of 19 g of a 18.6% aqueous solution (adjusted to pH 7.0) of an isobutyl-maleic anhydride copolymer, 18 g of a 9.1% solution of gum arabic and 28 g of water, and the resulting mixture was adjusted to pH 3.5. This mixed solution was heated to 60° C., 4.6 g of urea and 0.56 g of resorcinol were added thereto and emulsified and dispersed therein. Thereafter, 13 g of 30% formality was added and the resulting mixture was stirred for 1 hour. To this reaction mixture was added 9 g of 5% ammonium sulfate. After further 1 hour of reaction, the pH was adjusted to 7.0 to give a composition, E-1 or E-2, containing microcapsules 3.5 μm in size.

TABLE 4

| Photopolymerization initiator solutions | F-1 (g) | F-2 (g) |
|---|---|---|
| Methylene chloride | 2 | 2 |
| Iodine Salt of Dye Compound (D-7) | 0.14 | |
| Iodine Salt of Dye Compound (D-8) | | 0.14 |
| Photopolymerization Initiator (A-1) + (T-1) | 0.16 | 0.16 |

(Production of light-sensitive sheets and image receiving sheets):

A coating composition was prepared by adding 53 g of a 15% aqueous solution of polyvinly alcohol, 3.47 g of distilled water and 0.57 g of starch to 5 g of the capsule-containing composition E-1 or E-2 obtained in the above manner. The coating composition was coated on to an art paper using a coating rod 10 and dried at 50° C. for 15 minutes. Light-sensitive sheets 3 to 5 were obtained in this manner.

Separately, 0.6 g of 48% SBR latex, 4 g of a 10% aqueous solution of etherized starch, 2.1 g of zinc carbonate, 1.3 g of a 50% aqueous solution of sodium silicate, 0.1 g of sodium hexametaphosphate and 13 g of acid clay were added to 21.8 of water. The resultant mixture was stirred for 15 minutes using a homogenizer.

The thus-homogenized mixture was coated on to an art paper using a coating rod 18 and dried at 100° C. for 2 minutes to give an image receiving sheet.

(Image reproduction and results)

Image reproduction was carried out in the following manner. Each light-sensitive sheet was irradiated, through an original carrying a line drawing, with light from an extrahigh pressure mercury lamp using a jet light device (manufactured by ORC Co., Ltd.; 1KW) and via a step wedge [difference in density per step: 0.15; density steps Nos. 0 to 15; Fuji Step Guide P (trade name, manufactured by Fuji Photo Film Co., Ltd.)]. After exposure, the exposed light-sensitive sheet and the image receiving sheet were placed one over another with the coated sides brought into contact and passed through a pressure roll (linear pressure: 100 kg/cm). Capsules in unexposed portions were burst open and the capsule core substances were transferred to the image receiving sheet. The thus-transcribed portions gave a vivid black image with a density of 1.0. Portions corresponding to exposed portions varied in density in accordance with the light exposure and the lowest exposure step number where the density became 0.1 or less was taken as a measure of sensitivity. Thus, a higher exposure step number means a higher level of sensitivity. The results obtained are shown in Table 5.

TABLE 5

| | Results of evaluation | | |
|---|---|---|---|
| | Capsule-containing composition | Step number | Maximum absorption wavelength of light-sensitive sheet |
| 1 | E-1 | 3 | 550 nm |
| 2 | E-2 | 2 | 650 nm |

From the data shown in Table 5, it is evident that the photopolymerizable compositions according to the invention have high sensitivity.

EXAMPLE 6

The photobleachable dye composition solutions S'-1 to S'-5 (specified below in Table 6) were prepared.

One drop of any of the thus-obtained photobleachable dye composition solutions S'-1 to S'-5 was placed on a polyethylene terephthalate film (100 μm thick) and another polyethylene terephthalate film was further placed thereon to give a sample.

This sample was set in a vacuum printing frame and exposed to 50 counts of light under vacuum via a step wedge difference in density per step: 0.15; density steps Nos. 0 to 15; Fuji Step Guide P (trade name, manufactured by Fuji Photo Film Co., Ltd.)] using a jet light device (manufactured by ORC Co., Ltd.; 1KW). Samples S'-2 and S'-3 were photobleached in the step wedge-like manner, giving vivid positive images.

When exposed to 1,000 counts of light using a jet light device (manufactured by ORC Co., Ltd.; 1 KW), sample S'-5 was also photobleached in the step wedge-like manner, giving a vivid positive image.

The above results indicate that the organic cationic dye-organoaluminum compound anion salt according to the invention as well as the mixture of the nonionic dye and the organoaluminum compound anion salt can be photobleached is also evident that the mixture of the iodine salt of organic cationic dye and the tetrabutylammonium salt of organoaluminum compound anion is equivalent in performance to the organic cationic dye-organoaluminum compound anion complex presumably because the mixture can form such complex in solution.

TABLE 6

| Formulations of photobleachable dye compositions | S'-1 (g) | S'-2 (g) | S'-3 (g) | S'-4 (g) | S'-5 (g) |
|---|---|---|---|---|---|
| Methylene chloride | 2 | 2 | 2 | 2 | 2 |
| Dye compound (1) | 0.07 | 0.07 | | | |
| Dye compound (2) | | | | 0.05 | 0.05 |
| Organoaluminum compound (1) | | 0.11 | | | 0.11 |
| Organoaluminum compound (2) | | | 0.11 | | |
| Oil: tricresyl phosphate | 7 | 7 | 7 | 7 | 7 |

Monomer: Trimethylolpropane triacrylate

Dye compound (1) (iodine salt of D-7):

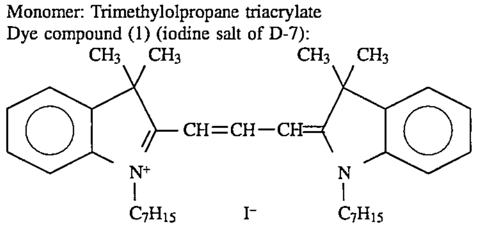

Dye compound (2):

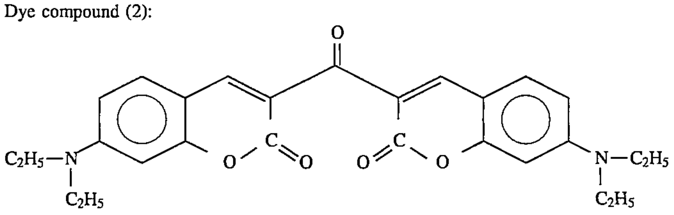

Organoaluminum compound (1) (salt of A-1 with T-2):

TABLE 6-continued

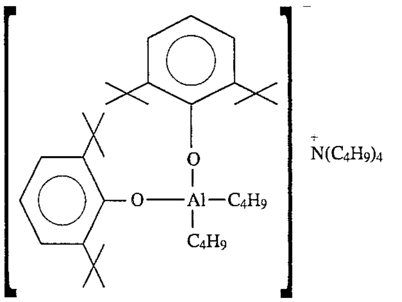

Organoaluminum compound (2) (salt of A-1 with D-7):

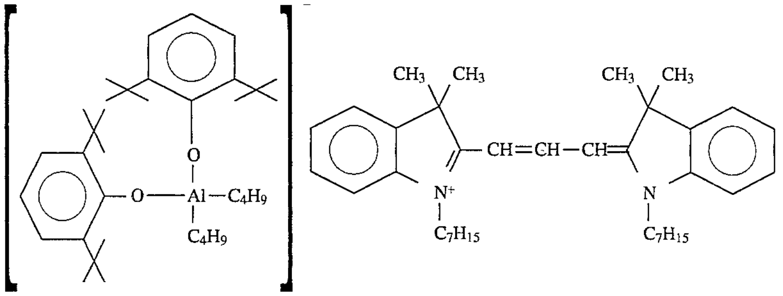

EXAMPLE 7

The photobleachable dye composition solutions S-6 to S-9 were prepared.

Samples were prepared in the same manner as Example 6 and each was set in a vacuum printing frame and exposed to 50 counts of light under vacuum via a step wedge (difference in density per step: 0.15; density steps Nos. 0 to 15; Fuji Step Guide P (trade name, manufactured by Fuji Photo Film Co., Ltd.)) using a jet light device (manufactured by ORC Co., Ltd.; 1 KW).

Samples S-6 and S-7 retained more or less the original red color even after photobleaching. With S-8 and S-9, exposed portions were bleached and turned colorless.

It is evident that the dye in the organic cationic dye-organoaluminum compound anion salt according to the present invention can be satisfactorily photobleached when the organoaluminum compound anion is present in an amount of at least 1.2 moles or more per mole of dye.

TABLE 7

Formulations of photobleachable dye compositions

| | S-6 (g) | S-7 (g) | S-8 (g) | S-9 (g) |
|---|---|---|---|---|
| Acetone | 20 | 20 | 20 | 20 |
| Dye compound (1) | 0.07 | 0.07 | 0.07 | 0.07 |
| Organoaluminum compound (1) | 0.068 | 0.085 | 0.102 | 0.17 |
| Polyvinyl acetate | 7 | 7 | 7 | 7 |
| Aluminum compound/dye compound (mole ratio) | 0.8/1 | 1/1 | 1.2/1 | 2/1 |

While the invention has been described in detail and with reference to specific examples thereof, it will be apparent to one skilled in the art that various changes and modifications can be made therein without departing from the spirit and scope thereof.

What is claimed is:

1. An aluminate complex capable of radical generation upon photoexcitation, wherein said aluminate complex comprises an aluminum compound anion moiety and a cationic compound moiety $D^+$ and is represented by formula (I):

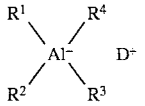 (I)

wherein $D^+$ is a cationic dye;

$R^1$ is a group represented by the following formulae (II) or (III); and $R^2$, $R^3$, and $R^4$ may be the same or different, and each is independently selected from the group consisting of an alkyl group, an aryl group, an aralkyl group, an alkaryl group, an alkenyl group, an alkynyl group, an alicyclic group, a group represented by formula (II) and a group represented by formula (III):

$$-X-R^5 \quad (II)$$

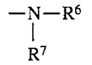 (III)

wherein X is an oxygen, sulfur or selenium atom, $R^5$ and $R^6$ are each an aryl group and $R^7$ is selected from the group consisting of an alkyl group and an aryl group; and wherein the aryl group represented by $R^5$ or $R^6$ may be substituted with an alkyl group having 1 to 16 carbon atoms, an aryl group, a halogen atom, a $-COOCH_3$ group and a methoxy group.

2. An aluminum complex as in claim 1, wherein said cationic dye is selected from the group consisting of cationic methine dyes, polymethine dyes, carbonium dyes, pyrylium-compounds, quinonimine dyes, xanthene dyes, acridine dyes and azulenium dyes.

3. An aluminate complex capable of radical generation upon photoexcitation, wherein said aluminate complex comprises an aluminum compound anion moiety and a cationic compound moiety $D^+$ and is represented by formula (I):

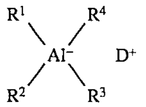
(I)
wherein $D^+$ is a cationic dye and wherein said aluminum compound anion moiety is selected from the group consisting of:
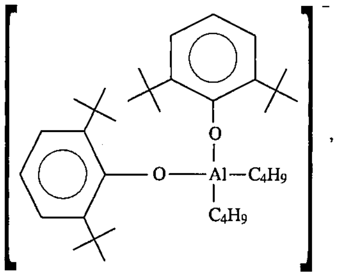
A-1
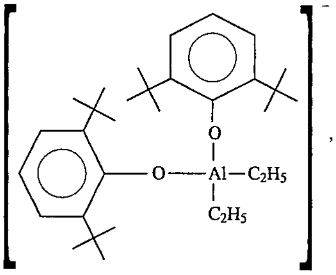
A-2
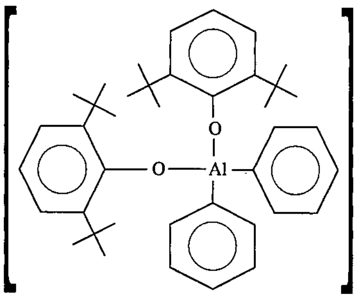
A-3
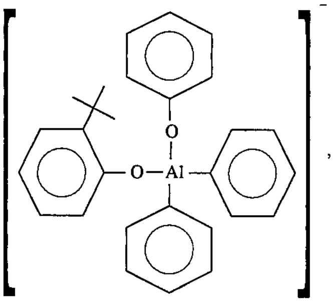
A-4
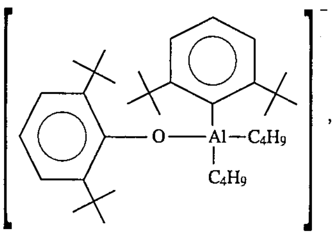
A-5
-continued
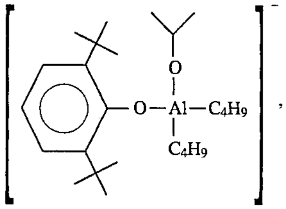
A-6
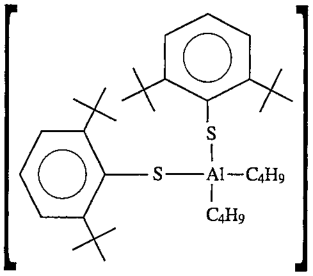
A-7
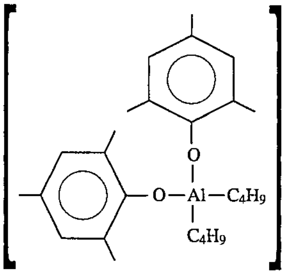
A-8
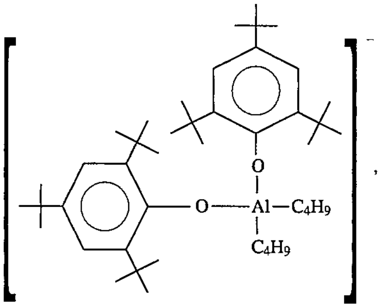
A-9
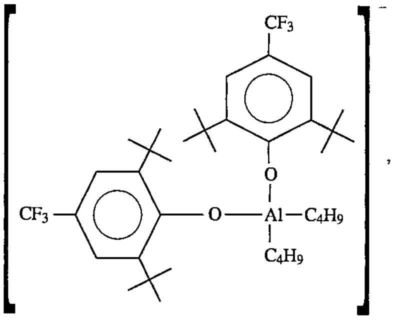
A-10
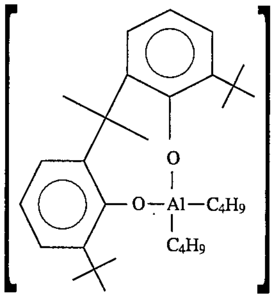
A-11

-continued
A-12
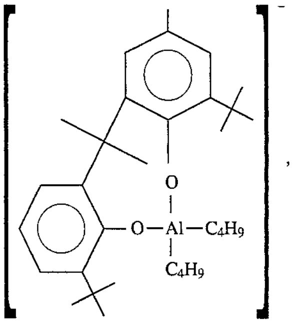
,
A-13
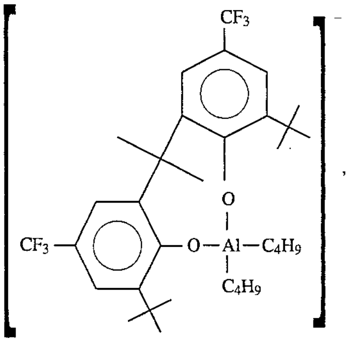
,
A-14
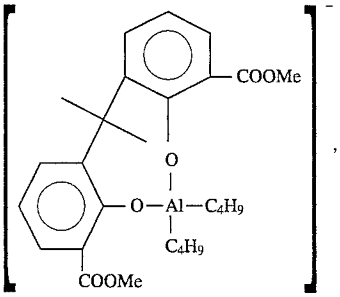
,
A-15
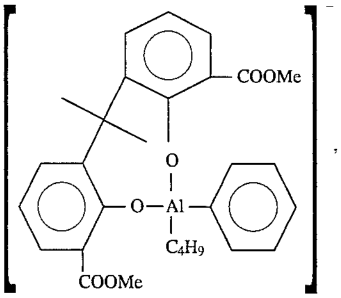
,
A-16
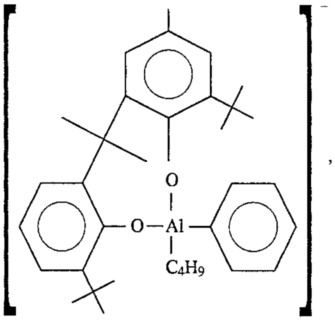
,
-continued
A-17
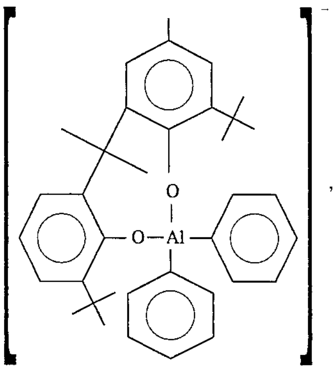
,
A-18
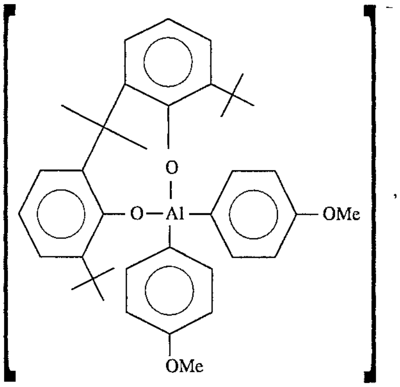
,
A-19
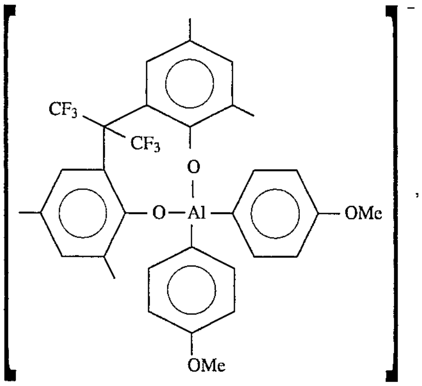
,
A-20
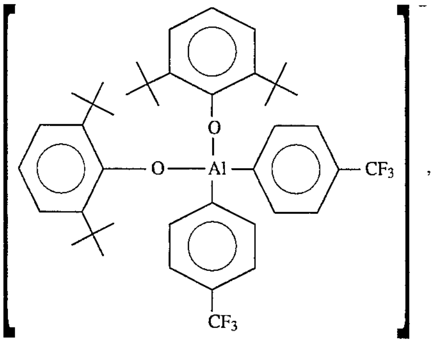
, -continued
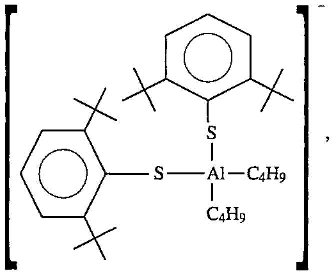,
A-21
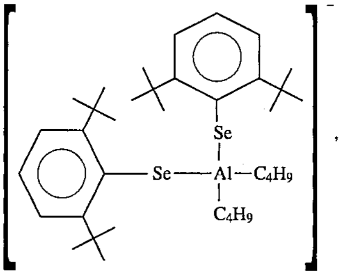,
A-22
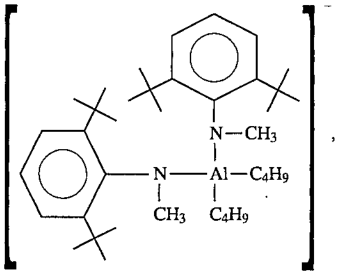,
A-23
-continued
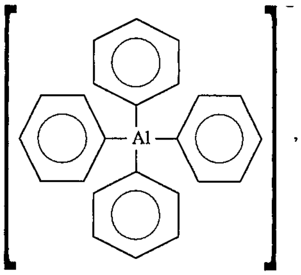,
A-24
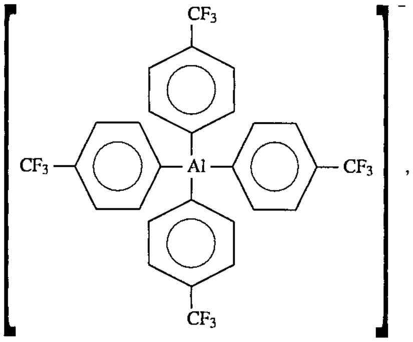,
A-25
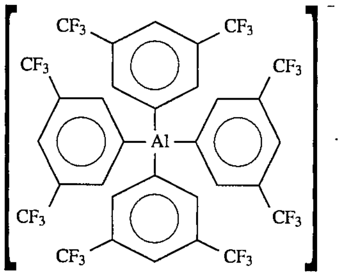.
A-26
* * * * *